(12) United States Patent
Takeuchi et al.

(10) Patent No.: US 11,799,516 B2
(45) Date of Patent: *Oct. 24, 2023

(54) RADIO FREQUENCY CIRCUIT AND COMMUNICATION DEVICE

(71) Applicant: Murata Manufacturing Co., Ltd., Kyoto (JP)

(72) Inventors: Morio Takeuchi, Nagaokakyo (JP); Syunsuke Kido, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/658,899

(22) Filed: Apr. 12, 2022

(65) Prior Publication Data

US 2022/0239333 A1 Jul. 28, 2022

Related U.S. Application Data

(63) Continuation of application No. 16/887,169, filed on May 29, 2020, now Pat. No. 11,336,330.

(30) Foreign Application Priority Data

May 30, 2019 (JP) .................... 2019-101466

(51) Int. Cl.
*H04B 1/7163* (2011.01)
*H03F 3/19* (2006.01)
(Continued)

(52) U.S. Cl.
CPC .......... *H04B 1/71637* (2013.01); *H03F 3/19* (2013.01); *H03H 7/0115* (2013.01); *H03H 9/54* (2013.01);
(Continued)

(58) Field of Classification Search
CPC . H04B 1/71637; H03F 3/19; H03F 2200/165; H03F 2200/294; H03F 2200/451; H03H 7/0115; H03H 9/54; H03H 9/64
(Continued)

(56) References Cited

U.S. PATENT DOCUMENTS 5,945,892 A * 8/1999 Kato .................... H03H 7/0115
336/200
9,449,749 B2 * 9/2016 Gupta ................. H01L 27/0811
(Continued)

FOREIGN PATENT DOCUMENTS

JP 04010718 A * 1/1992
JP H04-010718 A 1/1992
(Continued)

*Primary Examiner* — Hafizur Rahman
(74) *Attorney, Agent, or Firm* — Pearne & Gordon LLP

(57) ABSTRACT

A radio frequency circuit includes a first acoustic wave filter that is connected to a common terminal and includes a first acoustic wave resonator, a first LC filter that is connected to the common terminal via the first acoustic wave filter and includes at least one of an inductor or a capacitor, a second acoustic wave filter that is connected to the common terminal and includes a second acoustic wave resonator, and a second LC filter that is connected to the common terminal via the second acoustic wave filter and includes at least one of an inductor or a capacitor.

16 Claims, 12 Drawing Sheets

(51) Int. Cl.
  *H03H 9/54*    (2006.01)
  *H03H 7/01*    (2006.01)
  *H03H 9/64*    (2006.01)

(52) U.S. Cl.
  CPC ......... *H03H 9/64* (2013.01); *H03F 2200/165* (2013.01); *H03F 2200/294* (2013.01); *H03F 2200/451* (2013.01)

(58) Field of Classification Search
  USPC ....................................................... 333/193
  See application file for complete search history.

(56) References Cited

U.S. PATENT DOCUMENTS

| | | | |
|---|---|---|---|
| 9,735,752 B2* | 8/2017 | Madan | H03H 7/09 |
| 10,038,424 B2* | 7/2018 | Hey-Shipton | H03H 9/6433 |
| 10,804,882 B2* | 10/2020 | Matsubara | H03H 9/706 |
| 2004/0266378 A1 | 12/2004 | Fukamachi et al. | |
| 2011/0128092 A1 | 6/2011 | Fritz et al. | |
| 2018/0109243 A1 | 4/2018 | Takamine | |
| 2018/0198433 A1* | 7/2018 | Mori | H03H 7/1708 |
| 2019/0028085 A1* | 1/2019 | Kato | H03H 9/725 |
| 2019/0356344 A1 | 11/2019 | Takada | |

FOREIGN PATENT DOCUMENTS

| | | | |
|---|---|---|---|
| JP | H0669678 | * | 3/1994 |
| JP | 2006-128881 A | | 5/2006 |
| JP | 2019-205007 A | | 11/2019 |
| WO | 2016/208670 A1 | | 12/2016 |

\* cited by examiner

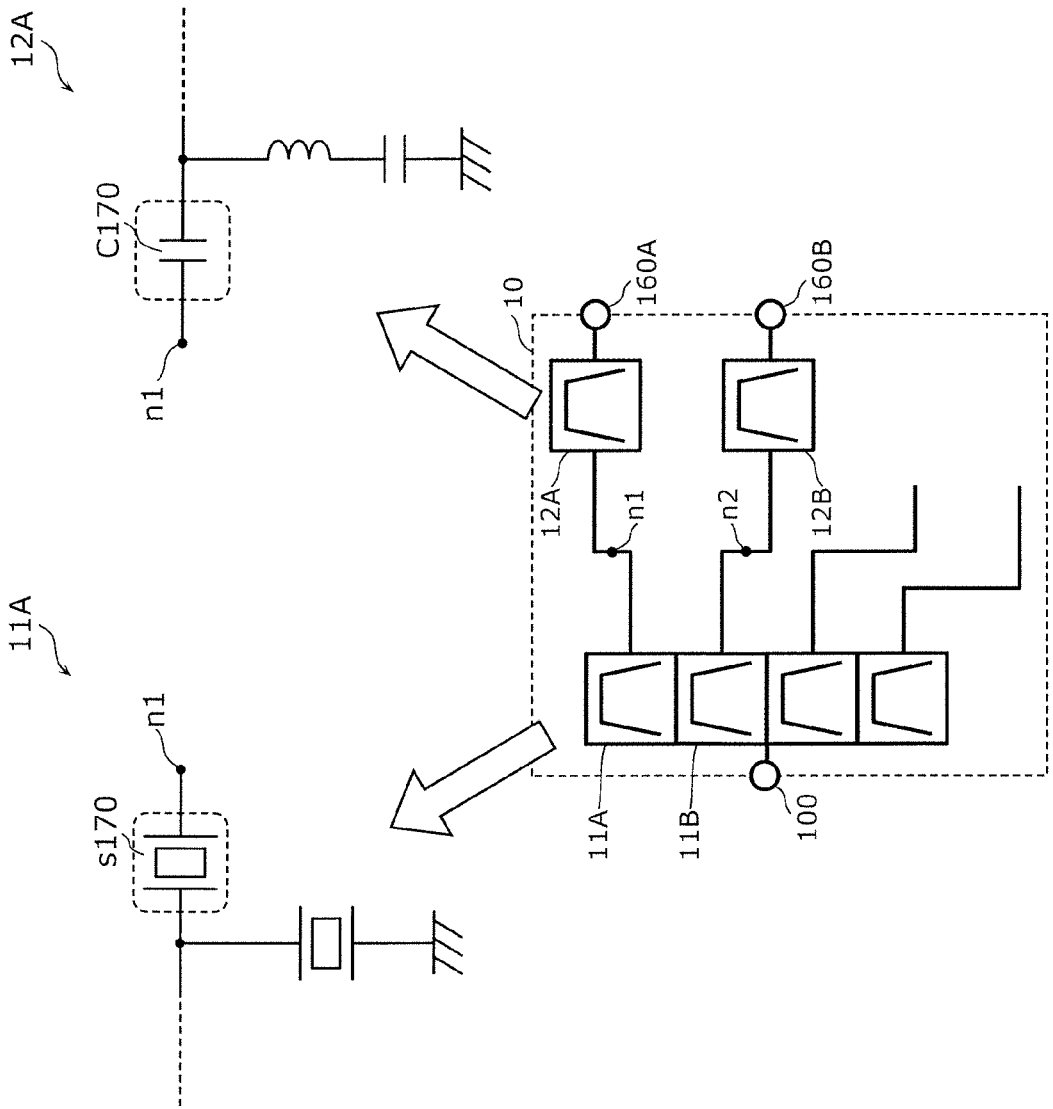

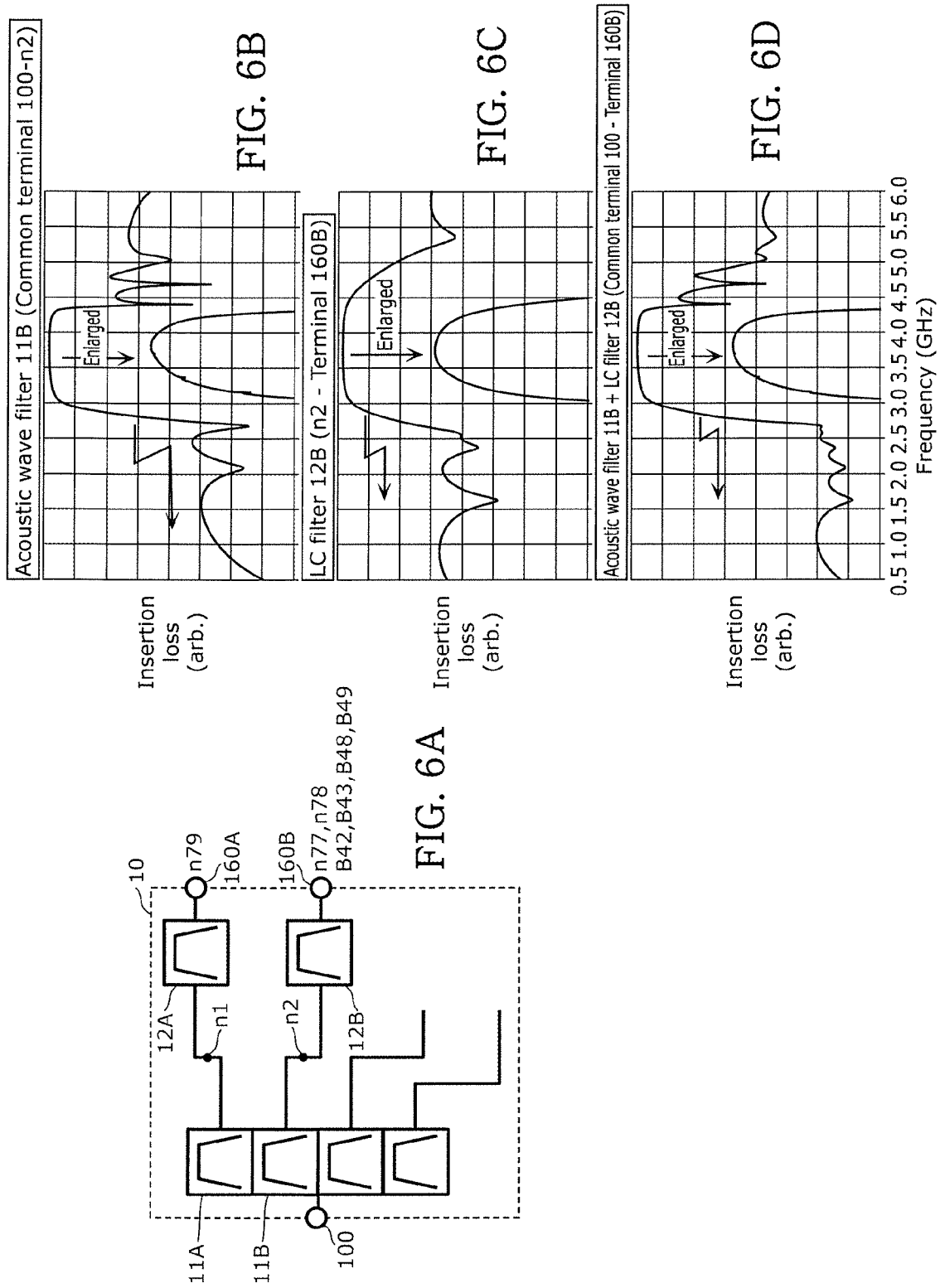

RADIO FREQUENCY CIRCUIT AND COMMUNICATION DEVICE

CROSS REFERENCE TO RELATED APPLICATION

The present application is a continuation of U.S. patent application Ser. No. 16/887,169 filed on May 29, 2020, which claims priority of Japanese Patent Application No. 2019-101466 filed on May 30, 2019. The entire disclosure of each of the above-identified applications, including the specification, drawings and claims is incorporated herein by reference in its entirety.

TECHNICAL FIELD

The present disclosure relates to a radio frequency circuit and a communication device.

BACKGROUND

In recent communication services, communication bandwidth has been increased and communication bands have been used simultaneously so as to achieve high-capacity and high-speed communication.

Patent Literature (PTL) 1 (Japanese Unexamined Patent Application Publication No. 2006-128881) discloses a multiplexer that multiplexes and demultiplexes radio frequency signals in two different communication bands. The multiplexer disclosed in PTL 1 includes an inductive-capacitive (LC) filter including an inductor and a capacitor. Accordingly, such a multiplexer multiplexes and demultiplexes radio frequency signals in a wide communication band.

BRIEF SUMMARY

For example, in the fifth generation mobile communication system (5G) to be introduced in the foreseeable future, a communication band has a higher frequency and a wider bandwidth, whereas a frequency interval (frequency gap) between two different communication bands is relatively narrow. When a communication band has a wider bandwidth and a frequency gap between two different communication bands is small as above, since attenuation slopes at both ends of a passband are not steep, a multiplexer including an LC filter as described in PTL 1 cannot ensure isolation between the two different communication bands. Accordingly, the propagation loss of radio frequency signals in the two different communication bands is increased.

In view of the above, the present disclosure has been conceived to solve the above problem, and has an object to provide radio frequency circuits and communication devices that multiplex or demultiplex radio frequency signals in communication bands with high isolation and low loss.

In order to achieve the above object, a radio frequency circuit according to one aspect of the present disclosure includes: a common terminal; a first acoustic wave filter that is connected to the common terminal and includes a first acoustic wave resonator; a first LC filter that is connected to the common terminal via the first acoustic wave filter and includes at least one of an inductor or a capacitor; a second acoustic wave filter that is connected to the common terminal and includes a second acoustic wave resonator; and a second LC filter that is connected to the common terminal via the second acoustic wave filter and includes at least one of an inductor or a capacitor.

The present disclosure provides radio frequency circuits and communication devices that multiplex or demultiplex radio frequency signals in communication bands with high isolation and low loss.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5 is an example of a circuit configuration diagram illustrating a neighborhood of a connection node between the acoustic wave filter and the LC filter of the radio frequency circuit according to the embodiment.

FIG. 6A is an example of a circuit configuration diagram in which the radio frequency circuit according to the embodiment is used for communication bands of the fourth generation mobile communication system (4G) Long Term Evolution (LTE) and 5G New Radio (NR), and FIGS. 6B, 6C, and 6D illustrate example graphs showing passing characteristics.

DETAILED DESCRIPTION

Figure 1:
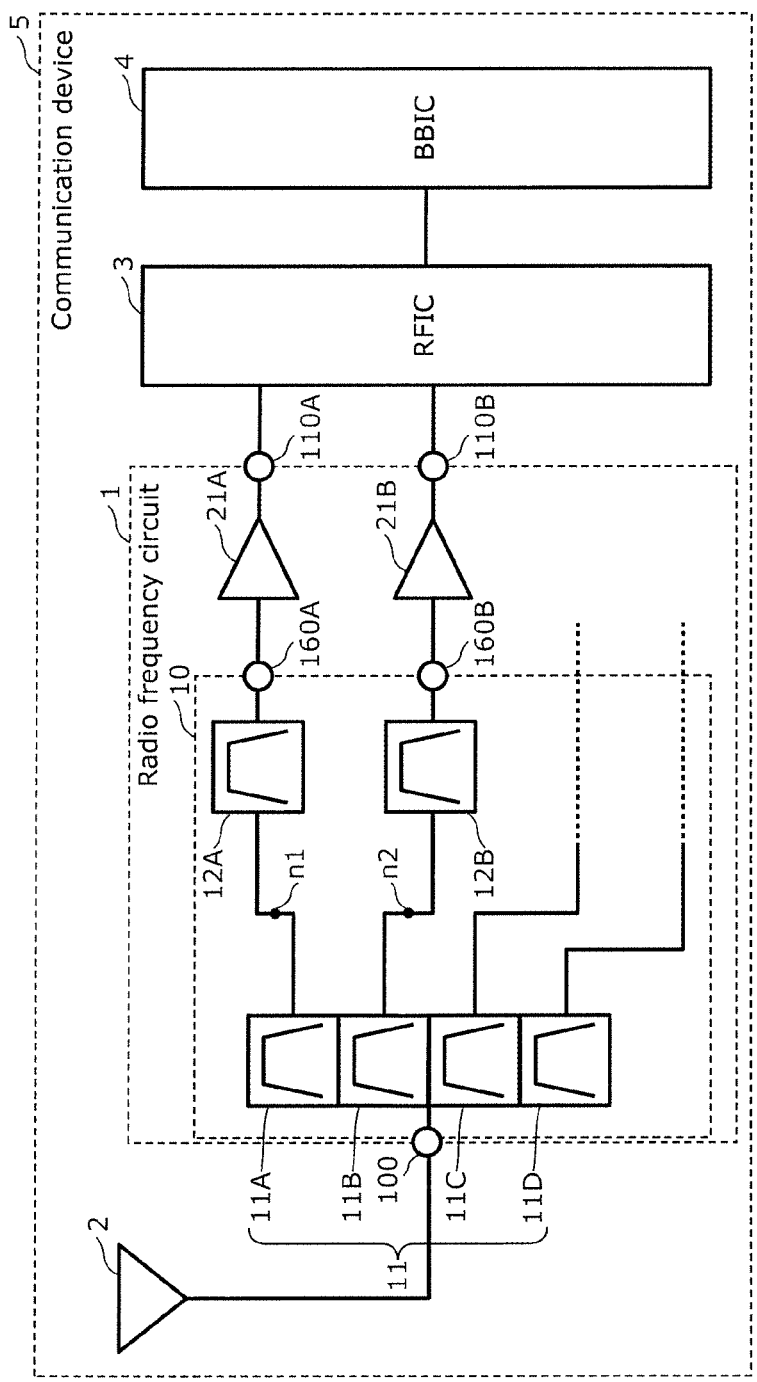
FIG. 1 is an example of a circuit configuration diagram illustrating a radio frequency circuit and a communication device according to an embodiment.

The following describes in detail embodiments of the present disclosure with reference to the drawings. It should be noted that the embodiment and variations described blow each show a general or specific example. The numerical values, shapes, materials, elements, the arrangement and connection of the elements, etc. indicated in the embodiment and variations are mere examples, and therefore are not intended to limit the present disclosure. Thus, among the elements in the following embodiment and variations, those not recited in any independent claim are described as optional elements. In addition, the sizes of elements and the ratios of the sizes illustrated in the drawings are not necessarily accurate.

1. Embodiment of Configurations of Radio Frequency Circuit and Communication Device FIG. 1 is an example of a circuit configuration diagram illustrating radio frequency circuit 1 and communication device 5 according to the embodiment. As illustrated in FIG. 1, communication device 5 includes radio frequency circuit 1, antenna element 2, radio frequency (RF) signal processing circuit (RFIC) 3, and baseband signal processing circuit (BBIC) 4.

Radio frequency circuit 1 includes common terminal 100, multiplexer 11, LC filters 12A and 12B, low-noise amplifiers 21A and 21B, and reception output terminals 110A and 110B.

Multiplexer 11 includes acoustic wave filters 11A, 11B, 11C, and 11D. It should be noted that acoustic wave filters 11A to 11D have mutually non-overlapping passbands.

Acoustic wave filter 11A is an example of a first acoustic wave filter. Specifically, acoustic wave filter 11A is a radio frequency filter that has an input terminal (a first input/output terminal) and an output terminal (a second input/output terminal), and includes a first acoustic wave resonator. The input terminal of acoustic wave filter 11A is connected to common terminal 100. The output terminal of acoustic wave filter 11A is connected to connection node n1. The first acoustic wave resonator is, for example, an acoustic wave resonator that uses surface acoustic waves (SAWs) or an acoustic wave resonator that uses bulk acoustic waves (BAWs).

Acoustic wave filter 11B is an example of a second acoustic wave filter. Specifically, acoustic wave filter 11B is a radio frequency filter that has an input terminal (a third input/output terminal) and an output terminal (a fourth input/output terminal), and includes a second acoustic wave resonator. The input terminal of acoustic wave filter 11B is connected to common terminal 100. The output terminal of acoustic wave filter 11B is connected to connection node n2. The second acoustic wave resonator is, for example, an acoustic wave resonator that uses SAWs or an acoustic wave resonator that uses BAWs.

Acoustic wave filter 11C is a radio frequency filter that has an input terminal and an output terminal, and includes an acoustic wave resonator. The input terminal of acoustic wave filter 11C is connected to common terminal 100. Acoustic wave filter 11D is a radio frequency filter that has an input terminal and an output terminal, and includes an acoustic wave resonator. The input terminal of acoustic wave filter 11D is connected to common terminal 100. The above acoustic wave resonators are each, for example, an acoustic wave resonator that uses SAWs or an acoustic wave resonator that uses BAWs.

It should be noted that multiplexer 11 may have a configuration that demultiplexes radio frequency signals in at least two different frequency ranges (communication bands). From this point of view, the number of radio frequency filters included in multiplexer 11 may be two or higher.

LC filter 12A is an example of a first LC filter. Specifically, LC filter 12A is a radio frequency filter that has an input terminal (a fifth input/output terminal) and an output terminal (a sixth input/output terminal), and includes at least one of an inductor or a capacitor. The input terminal of LC filter 12A is connected to the output terminal of acoustic wave filter 11A via connection node n1. The output terminal of LC filter 12A is connected to terminal 160A.

LC filter 12B is an example of a second LC filter. Specifically, LC filter 12B is a radio frequency filter that has an input terminal (a seventh input/output terminal) and an output terminal (an eighth input/output terminal), and includes at least one of an inductor or a capacitor. The input terminal of LC filter 12B is connected to the output terminal of acoustic wave filter 11B via connection node n2. The output terminal of LC filter 12B is connected to terminal 160B.

It should be noted that although circuit elements connected to the output terminals of acoustic wave filters 11C and 11D are omitted in FIG. 1, LC filters may be connected to these respective output terminals.

Low-noise amplifier 21A is an example of the first amplifier, and has an input terminal connected to the output terminal of LC filter 12A via terminal 160A, and an output terminal connected to reception output terminal 110A. Low-noise amplifier 21A amplifies a received radio frequency signal that has been inputted from common terminal 100 and has passed through acoustic wave filter 11A and LC filter 12A, and outputs the amplified radio frequency signal to RFIC 3.

Low-noise amplifier 21B is an example of a second amplifier, and has an input terminal connected to the output terminal of LC filter 12B via terminal 160B, and an output terminal connected to reception output terminal 110B. Low-noise amplifier 21B amplifies a received radio frequency signal that has been inputted from common terminal 100 and has passed through acoustic wave filter 11B and LC filter 12B, and outputs the amplified radio frequency signal to RFIC 3.

It should be noted that input terminal sides of low-noise amplifiers 21A and 21B often have a configuration in which capacitors are connected in series. Consequently, it is desirable that output terminal sides of LC filters 12A and 12B have a configuration in which capacitors are connected in series. Accordingly, it is possible to optimize an impedance matching between low-noise amplifier 21A and LC filter 12A, and an impedance matching between low-noise amplifier 21B and LC filter 12B.

It should be noted that although radio frequency circuit 1 according to the present embodiment is a reception circuit that transfers radio frequency signals received by antenna element 2 to RFIC 3, radio frequency circuit 1 may be a transmission circuit that transfers radio frequency signals outputted from RFIC 3, to antenna element 2. When radio frequency circuit 1 is configured as a transmission circuit, power amplifiers are disposed instead of low-noise amplifiers 21A and 21B. Further, radio frequency circuit 1 may be a transmission and reception circuit having both functions of transmissions and receptions.

It should be noted that multiplexer 11 and LC filters 12A and 12B may constitute radio frequency module 10 disposed on the same substrate as these components. For example, LC filters 12A and 12B may each include an inductor having a planar coil pattern in the substrate, and a capacitor having a planar electrode in the substrate, and multiplexer 11 may be mounted on the substrate.

Further, radio frequency circuit 1 does not necessarily include low-noise amplifiers 21A and 21B.

The following describes elements other than radio frequency circuit 1 that constitute communication device 5.

Antenna element 2 is connected to common terminal 100 of radio frequency circuit 1, and receives radio frequency signals. Moreover, when radio frequency circuit 1 is configured as a transmission circuit or a transmission and reception circuit, antenna element 2 may emit radio frequency signals transferred to radio frequency circuit 1 from RFIC 3.

RFIC 3 processes radio frequency signals outputted from radio frequency circuit 1 via reception output terminals 110A and 110B. Moreover, when radio frequency circuit 1 is configured as a transmission circuit or a transmission and reception circuit, RFIC 3 processes a transmission signal inputted from BBIC 4 by up-conversion etc., and outputs radio frequency signals generated by being processed to radio frequency circuit 1. Furthermore, RFIC 3 includes a controller that outputs a control signal for switching connection states of switch circuits 13 to 15 to be described below, based on a communication band to be used. It should be noted that the controller may be disposed outside RFIC 3, and may be disposed in, for example, radio frequency circuit 1 or BBIC 4.

BBIC 4 performs signal processing using an intermediate frequency band having a frequency lower than that of radio frequency signals transferred through radio frequency circuit 1. A signal processed by BBIC 4 is used as, for example, an image signal for displaying an image or an audio signal for talking via a loudspeaker.

Figure 2A:
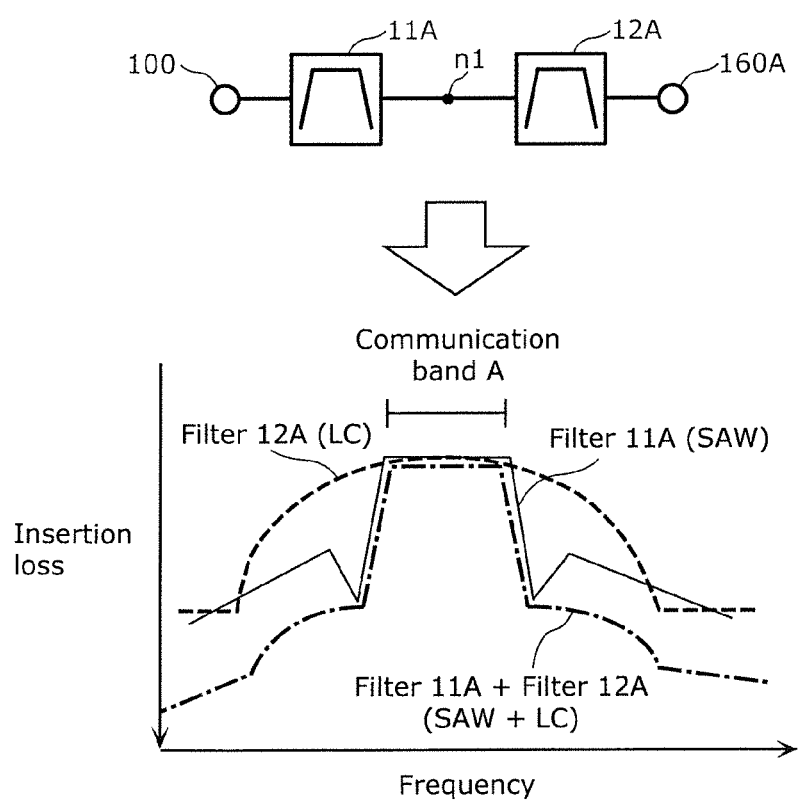
FIG. 2A is an example diagram illustrating passing characteristics and combined passing characteristics of an acoustic wave filter and an LC filter included in the radio frequency circuit according to the embodiment.

2. Passing Characteristics of Radio Frequency Circuit 1 According to the Embodiment FIG. 2A is an example diagram illustrating passing characteristics and combined passing characteristics of acoustic wave filter 11A and LC filter 12A included in radio frequency circuit 1 according to the embodiment. The top of FIG. 2A shows a circuit in which acoustic wave filter 11A and LC filter 12A included in radio frequency circuit 1 are connected in series. The bottom graph drawing of FIG. 2A shows the passing characteristics of acoustic wave filter 11A alone (the solid line), the passing characteristics of LC filter 12A alone (the broken line), and the passing characteristics of the series circuit of acoustic wave filter 11A and LC filter 12A (the alternate long and short dash line).

As illustrated in the bottom graph drawing of FIG. 2A, since acoustic wave filter 11A includes a first acoustic wave resonator (e.g., a SAW resonator) having a high Q factor, the passing characteristics (SAW) of acoustic wave filter 11A are that (1) there is low loss within a passband, and (2) since attenuation slopes at both ends of the passband are steep, a large amount of attenuation in attenuation bands in a neighborhood of the passband can be ensured. On the other hand, (3) there is an attenuation band (a band in which attenuation rebounds) with an amount of attenuation that decreases with a distance from the passband due to a rebound of high attenuation in the neighborhood of the passband.

In contrast, since LC filter 12A includes an inductor and a capacitor, the passing characteristics (LC) of LC filter 12A are that (1) since attenuation slopes at both ends of a passband are gentle, an amount of attenuation in attenuation bands in a neighborhood of the passband is small, compared to the passing characteristics of acoustic wave filter 11A. On the other hand, (2) there is low loss within the passband and the passband width is relatively wide, and (3) wide and stable attenuation can be ensured in an attenuation band away from the passband.

Regarding the passing characteristics (SAW+LC) of the series circuit of acoustic wave filter 11A and LC filter 12A having the above-described passing characteristics, the attenuation band in the neighborhood of the passband strongly reflects the passing characteristics of acoustic wave filter 11A, and the attenuation band away from the passband strongly reflects the passing characteristics of LC filter 12A.

In other words, connecting acoustic wave filter 11A and LC filter 12A in series enables the series circuit to have the passing characteristics in which (i) low loss in a passband, (ii) high attenuation in a neighborhood of the passband, and (iii) high attenuation in a band away from the passband are ensured. It should be noted that even a series circuit obtained by changing the series connection order of acoustic wave filter 11A and LC filter 12A will have the passing characteristics in which (i) to (iii) are ensured.

Figure 2B:
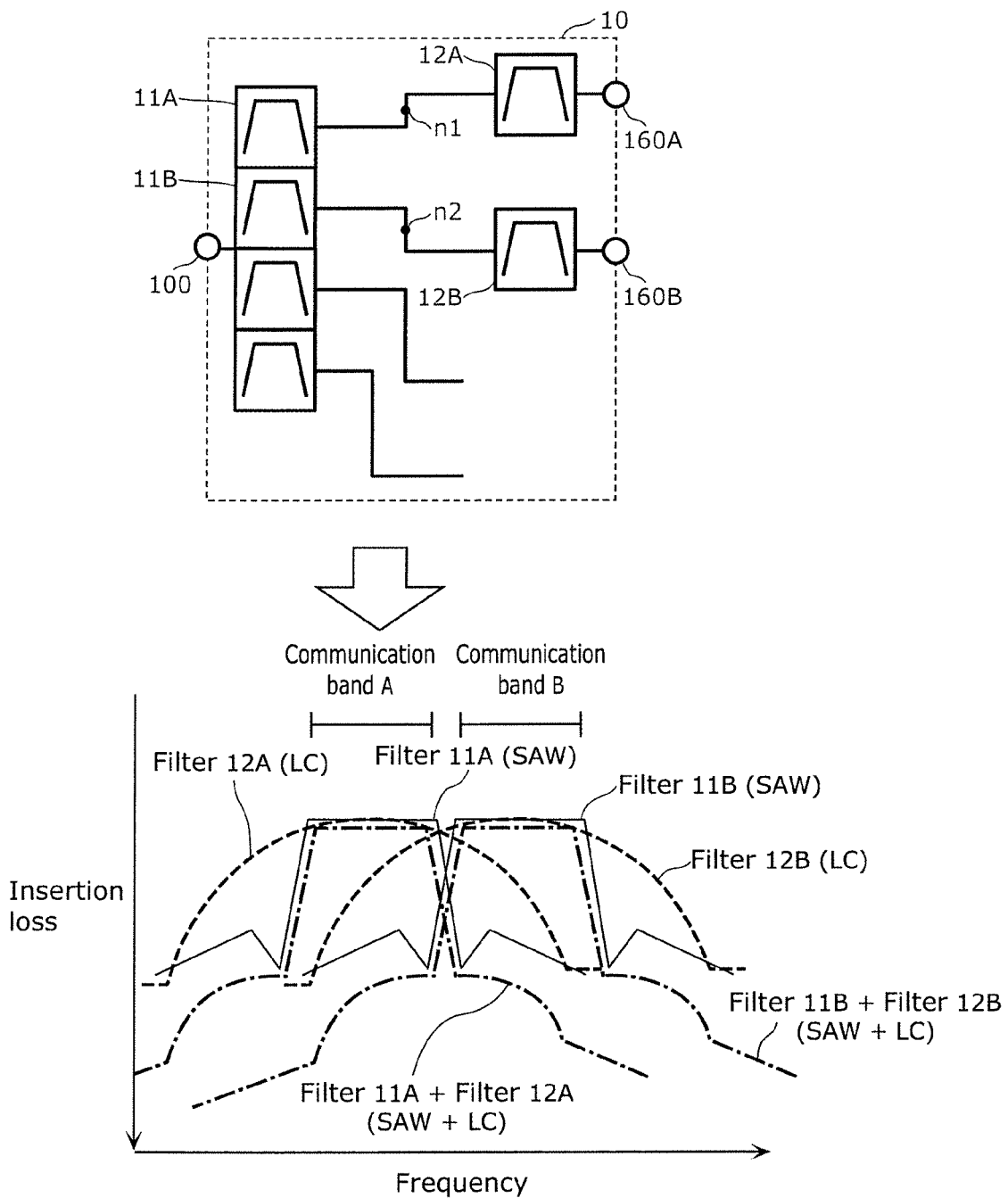
FIG. 2B is an example diagram illustrating passing characteristics of the radio frequency circuit according to the embodiment.

FIG. 2B is a diagram illustrating passing characteristics of radio frequency circuit 1 according to the embodiment. The top of FIG. 2B shows a circuit configured as radio frequency module 10 included in radio frequency circuit 1. The bottom graph drawing of FIG. 2B shows the passing characteristics of acoustic wave filter 11A alone (the solid line on the low-frequency side), the passing characteristics of acoustic wave filter 11B alone (the solid line on the high-frequency side), the passing characteristics of LC filter 12A alone (the broken line on the low-frequency side), the passing characteristics of LC filter 12B alone (the broken line on the high-frequency side), the passing characteristics of the series circuit of acoustic wave filter 11A and LC filter 12A (the alternate long and short dash line on the low-frequency side), and the passing characteristic of the series circuit of acoustic wave filter 11B and LC filter 12B (the alternate long and short dash line on the high-frequency side).

It should be noted that in the present embodiment, the series circuit of acoustic wave filter 11A and LC filter 12A passes radio frequency signals in communication band A, and the series circuit of acoustic wave filter 11B and LC filter 12B passes radio frequency signals in communication band B. Here, it is assumed that communication band A has a frequency range that does not overlap a frequency range of communication band B, and communication band A is closer to the low-frequency side than communication band B.

As illustrated in the bottom graph drawing of FIG. 2B, the series circuit of acoustic wave filter 11A and LC filter 12A have the passing characteristics in which low loss in a passband (communication band A), high attenuation in a neighborhood of the passband (communication band A), and high attenuation in a band away from the passband (communication band A) are ensured.

Further, the series circuit of acoustic wave filter 11B and LC filter 12B have the passing characteristics in which low loss in a passband (communication band B), high attenuation in a neighborhood of the passband (communication band B), and high attenuation in a band away from the passband (communication band B) are ensured.

A comparative radio frequency circuit has a configuration in which a multiplexer that demultiplexes radio frequency signals in a first frequency band group including communication bands and radio frequency signals in a second frequency band group including communication bands is disposed upstream, and filters having respective communication bands as passbands are disposed downstream. In this case, an LC filter favorable for ensuring a wide passband that is a frequency band group is used as the multiplexer disposed upstream, and acoustic wave filters favorable for ensuring relatively narrow passbands that are the respective communication bands are used as the filters disposed downstream.

Radio frequency circuit 1 according to the present embodiment has the same passing characteristics of the series circuit alone including the acoustic wave filter and the LC filter as the comparative radio frequency circuit. Radio frequency circuit 1, however, differs from the comparative radio frequency circuit in that, when the front ends of two series circuits corresponding to different communication bands are connected with a common terminal, a difference in passing characteristics of the multiplexer disposed upstream makes a significant difference in propagation characteristics of radio frequency signals.

For example, in the fifth generation mobile communication system (5G) to be introduced in the foreseeable future, a communication band has a higher frequency and a wider bandwidth, and a frequency gap between adjacent communication bands is relatively small. When a communication band has a wider bandwidth and a frequency gap between the adjacent communication bands is small as above, the propagation loss of radio frequency signals is increased in the comparative radio frequency circuit as described above.

For the purpose of describing the above, it is assumed that a multiplexer disposed upstream as a comparative radio frequency circuit includes a first LC filter having a passband that is communication band A and a second LC filter having a passband that is communication band B. In this case, although communication band A and communication band B have wide bandwidths, whereas a frequency gap between communication band A and communication band B is relatively small, attenuation slopes in neighborhoods of the passbands of the first LC filter and the second LC filter are less steep. For this reason, a radio frequency signal in communication band A passes through the second LC filter without necessarily selectively passing through the first LC filter due to a small amount of attenuation in the neighborhood of the passband of the second LC filter. Likewise, a radio frequency signal in communication band B passes through the first LC filter without necessarily selectively passing through the second LC filter due to a small amount of attenuation in the neighborhood of the passband of the first LC filter. In other words, since isolation between the adjacent communication bands deteriorates due to the lack of steepness of the attenuation slopes in the neighborhoods of the passbands of the LC filters, in particular, the propagation loss of the radio frequency signals in adjacent communication bands A and B is increased.

In contrast, since multiplexer 11 connected to common terminal 100 includes acoustic wave filters 11A to 11D having highly steep attenuation slopes in neighborhoods of passbands, radio frequency circuit 1 according to the present embodiment demultiplexes radio frequency signals in communication band A and radio frequency signals in communication band B with high isolation even when communication band A and communication band B are relatively close to each other. Moreover, although acoustic wave filters 11A to 11D included in multiplexer 11 each have a small amount of attenuation in a band (a band in which attenuation rebounds) away from the passband, since LC filters 12A and 12B each of which widely and stably ensures attenuation in the band away from the passband are disposed downstream, radio frequency circuit 1 highly attenuates the band away from the passband. Accordingly, radio frequency circuit 1 demultiplexes radio frequency signals in communication bands with high isolation and low loss.

3. Example of Usage for 5G NR

Radio frequency circuit 1 and communication device 5 according to the present embodiment can be used for 5G. For example, n79, having a frequency range from 4400 MHz to 5000 MHz, of New Radio (NR) is used as communication band B, and n77, having a frequency range from 3300 MHz to 4200 MHz, of NR is used as communication band A. n79 has a bandwidth of 600 MHz, and n77 has a bandwidth of 900 MHz. A frequency gap between n79 and n77 is 200 MHz. In other words, compared to communication bands specified in 4G, communication bands specified in 5G have a wide bandwidth and a frequency gap between adjacent ones of the communication bands is small.

When n79 and n77 of 5G described as the example above are used in a comparative radio frequency circuit, a configuration in which a transfer circuit for n79 and a transfer circuit for n77 are connected to separate antenna elements is first conceivable as a means for ensuring high isolation. This makes it possible to transfer signals in n79 and n77 having a small frequency gap with high isolation. Unfortunately, since the number of antenna elements increases, a communication device grows in size.

Moreover, a configuration in which an acoustic wave filter that uses one antenna element and makes steeper attenuation slopes in a neighborhood of a passband is disposed as a multiplexer in each of a transfer circuit for n79 and a transfer circuit for n77 is conceivable as another means for ensuring high isolation. This makes it possible to ensure high isolation in a boundary area between n79 and n77 having a small frequency gap. However, since the acoustic wave filter has a small amount of attenuation in a band (a band in which attenuation rebounds) away from the passband, for example, it is not possible to sufficiently ensure amounts of attenuation on a low-frequency side range in n77 and a high-frequency side range in n79. Accordingly, it is difficult to ensure high isolation over an entire band relative to radio frequency signals in n77 and n79.

Furthermore, a configuration in which an LC filter that uses one antenna element and attenuates a band away from a passband is disposed as a multiplexer in each of a transfer circuit for n79 and a transfer circuit for n77 is conceivable as still another means for ensuring high isolation. In this case, as stated above, since isolation between the adjacent communication bands deteriorates due to the lack of steepness of attenuation slopes in a neighborhood of the passband of the LC filter, the propagation loss is increased.

In contrast, when radio frequency circuit 1 and communication device 5 according to the present embodiment are used for 5G NR, the acoustic wave filter disposed upstream ensures isolation in a boundary area between two communication bands having a small frequency gap, and the LC filter disposed downstream ensures isolation over the entirety of a wide communication band, and further highly attenuates an undesired signal in Sub6 (a frequency range from 400 MHz to 7 GHz).

It should be noted that communication bands used in radio frequency circuit 1 and communication device 5 according to the present embodiment are not limited to above n77 and n79.

For example, at least part of n79 of NR may be used as communication band B, and at least one of at least part of n77 of NR, at least part of n78, having a frequency range from 3300 MHz to 3800 MHz, of NR, B42, having a frequency range from 3400 MHz to 3600 MHz, of LTE, B43, having a frequency range from 3600 MHz to 3800 MHz, of LTE, B48, having a frequency range from 3550 MHz to 3700 MHz, of LTE, or B49, having a frequency range from 3550 MHz to 3700 MHz, of LTE may be used as communication band A.

It should be noted that, for example, in n77 (3.3 GHz to 4.2 GHz) of NR, a frequency range of 3.6 to 4.1 GHz is allotted in Japan, and further a subdivided frequency range such as a frequency range of 3.7 to 3.8 GHz and a frequency range of 4.0 to 4.1 GHz is allocated to each telecommunications carrier. For this reason, each of communication bands A and B may be equivalent to part of n77, n78, or n79 of NR.

In other words, at least one of acoustic wave filter 11A or acoustic wave filter 11B may have a passband that is n79 of NR, and the other of acoustic wave filters 11A and 11B may have a passband that is at least one of n77 of NR, n78 of NR, B42 of LTE, B43 of LTE, B48 of LTE, or B49 of LTE.

Accordingly, it is possible to transfer signals in communication bands of 5G NR with high isolation and low loss, and further transfer signals in the communication bands of 5G NR and communication bands of 4G LTE with high isolation and low loss.

Moreover, for example, NR-U having a frequency range from 5.15 GHz to 5.925 GHz may be used as communication band B, and NR having a frequency range from 4.4 GHz to 5.0 GHz less than or equal to 5 GHz may be used as communication band A.

Moreover, for example, NR-U having a frequency range from 5.47 GHz to 5.925 GHz may be used as communication band B, and NR-U having a frequency range from 5.15 GHz to 5.35 GHz may be used as communication band A.

Moreover, for example, NR-U having a frequency range from 5.925 GHz to 7.125 GHz may be used as communication band B, and NR-U having a frequency range from 5.15 GHz to 5.85 GHz may be used as communication band A.

It should be noted that NR-U is 5G-NR greater than or equal to 5 GHz in 3GPP, and is equivalent to communication band U-NII in an unlicensed band allocated by the Federal Communications Commission (FCC).

In other words, (1) the first acoustic wave filter and the second acoustic wave filter may have a passband that is a communication band of New Radio (NR) less than or equal to 5 GHz, (2) the first acoustic wave filter may have a passband that is a communication band of NR less than or equal to 5 GHz, and the second acoustic wave filter has a passband that is an unlicensed band of Long Term Evolution (LTE), NR, or Wireless Local Area Network (WLAN) greater than or equal to 5 GHz, or (3) the first acoustic wave filter and the second acoustic wave filter may have a passband that is an unlicensed band of LTE, NR, or WLAN greater than or equal to 5 GHz.

At least one of wireless LAN (2.4 GHz), wireless LAN (5 GHz) encompassing B46 and B47 of LTE, a low band group (617 to 960 MHz), GPS (registered trademark)-L1 (1559 to 1606 MHz), GPS-L5 (1166 to 1229 MHz), a middle band group (1427 to 2200 MHz), a high band group (2300 to 2690 MHz), or an ultrahigh band group (3300 to 4990 MHz) may be used as each of passbands of acoustic wave filters 11C and 11D included in multiplexer 11.

4. Passing Characteristics of Radio Frequency Circuit 6 According to Variation Embodiment 1

Figure 3A:
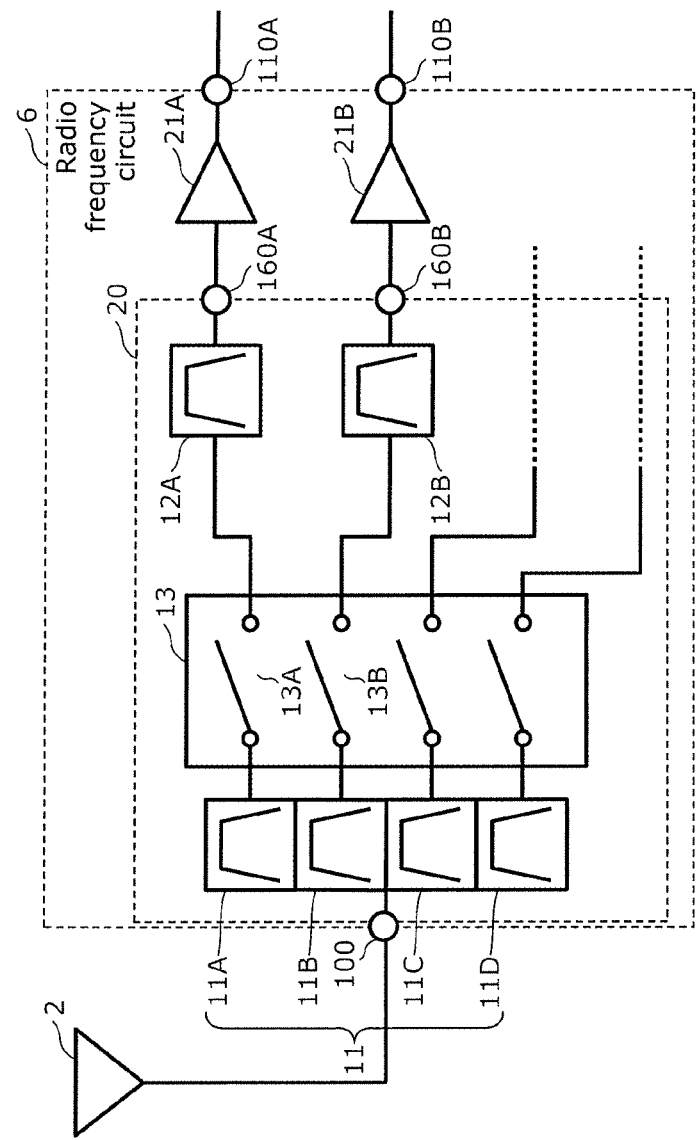
FIG. 3A is an example of a circuit configuration diagram illustrating a radio frequency circuit and an antenna element according to Variation embodiment 1 of the embodiment.

FIG. 3A is an example circuit configuration diagram illustrating radio frequency circuit 6 and antenna element 2 according to Variation embodiment 1 of the embodiment. As illustrated in FIG. 3A, radio frequency circuit 6 according to the present variation includes common terminal 100, multiplexer 11, LC filters 12A and 12B, switch circuit 13, low-noise amplifiers 21A and 21B, and reception output terminals 110A and 110B.

Radio frequency circuit 6 according to the present variation embodiment differs from radio frequency circuit 1 according to the present embodiment only in that switch circuit 13 is added. In what follows, a description of similarities in configuration between radio frequency circuit 6 according to the present variation embodiment and radio frequency circuit 1 according to the present embodiment is omitted, and differences in configuration therebetween are mainly described.

Switch circuit 13 is disposed between multiplexer 11 and LC filters 12A and 12B, and includes switches 13A and 13B. Switch 13A is an example of a first switch, is disposed between acoustic wave filter 11A and LC filter 12A, and switches between making a connection and making a disconnection between acoustic wave filter 11A and LC filter 12A. Switch 13A is, for example, a single-pole-single-throw (SPST) switch. Switch 13B is an example of a second switch, is disposed between acoustic wave filter 11B and LC filter 12B, and switches between making a connection and making a disconnection between acoustic wave filter 11B and LC filter 12B. Switch 13B is, for example, an SPST switch.

Switch circuit 13 puts a reception path on which acoustic wave filter 11A and LC filter 12A are disposed and a reception path on which acoustic wave filter 11B and LC filter 12B are disposed, into an OFF state (a signal non-propagation state), according to a usage state of communication bands.

5. Passing Characteristics of Radio Frequency Circuit 7 According to Variation Embodiment 2

Figure 3B:
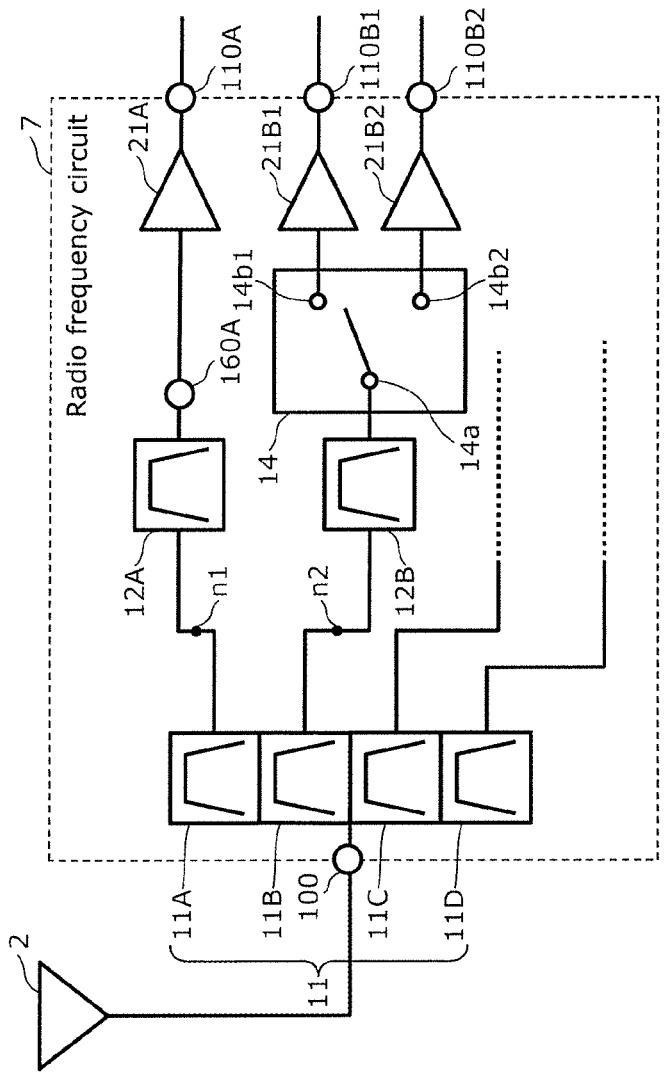
FIG. 3B is an example of a circuit configuration diagram illustrating a radio frequency circuit and an antenna element according to Variation embodiment 2 of the embodiment.

FIG. 3B is an example of a circuit configuration diagram illustrating radio frequency circuit 7 and antenna element 2 according to Variation embodiment 2 of the embodiment. As illustrated in FIG. 3B, radio frequency circuit 7 according to the present variation embodiment includes common terminal 100, multiplexer 11, LC filters 12A and 12B, switch circuit 14, low-noise amplifiers 21A, 21B1, and 21B2, and reception output terminals 110A, 110B1, and 110B2.

Radio frequency circuit 7 according to the present variation embodiment differs from radio frequency circuit 1 according to the above embodiment in that low-noise amplifiers 21B1 and 21B2 are disposed in place of low-noise amplifier 21B, and switch circuit 14 is added. In what follows, a description of similarities in configuration between radio frequency circuit 7 according to the present variation embodiment and radio frequency circuit 1 according to the above embodiment is omitted, and differences in configuration therebetween are mainly described.

Low-noise amplifier 21A is an example of the first amplifier, and has an input terminal connected to the output terminal of LC filter 12A via terminal 160A, and an output terminal connected to reception output terminal 110A. Low-noise amplifier 21A amplifies a received radio frequency signal in communication band A that has been inputted from common terminal 100 and has passed through acoustic wave filter 11A and LC filter 12A, and outputs the amplified radio frequency signal to RFIC 3.

Low-noise amplifier 21B1 is an example of the second amplifier, and has an input terminal connected to the output terminal of LC filter 12B via switch circuit 14, and an output terminal connected to reception output terminal 110B1. Low-noise amplifier 21B1 amplifies a received radio frequency signal in communication band B1 that has been inputted from common terminal 100 and has passed through acoustic wave filter 11B and LC filter 12B, and outputs the amplified radio frequency signal to RFIC 3.

Low-noise amplifier 21B2 is an example of the second amplifier, and has an input terminal connected to the output terminal of LC filter 12B via switch circuit 14, and an output terminal connected to reception output terminal 110B2. Low-noise amplifier 21B2 amplifies a received radio frequency signal in communication band B2 that has been inputted from common terminal 100 and has passed through acoustic wave filter 11B and LC filter 12B, and outputs the amplified radio frequency signal to RFIC 3.

The series circuit of acoustic wave filter 11A and LC filter 12A passes radio frequency signals in communication band A, and the series circuit of acoustic wave filter 11B and LC filter 12B passes radio frequency signals in communication band B.

Switch circuit 14 includes common terminal 14a and selection terminals 14b1 and 14b2, switches between making a connection and making a disconnection between LC filter 12B and low-noise amplifier 21B1, and switches between making a connection and making disconnection between LC filter 12B and low-noise amplifier 21B2. Switch circuit 14 is, for example, a single-pole-single-throw (SPST) switch.

According to the above configuration, putting common terminal 14a and selection terminal 14b1 into the connection state enables simultaneous reception of signals in communication band A and communication band B1, and putting common terminal 14a and selection terminal 14b2 into the connection state enables simultaneous reception of signals in communication band A and communication band B2. Moreover, since low-noise amplifiers 21B1 and 21B2 amplify the radio frequency signal in communication band B1 and the radio frequency signal in communication band B2, respectively, it is possible to set the amplification characteristics of low-noise amplifiers 21B1 and 21B2 exclusively for respective communication bands B1 and B2. Accordingly, it is possible to enhance performance regarding the gain, distortion characteristics, and power consumption of low-noise amplifiers 21B1 and 21B2.

Furthermore, radio frequency circuit 7 according to the present variation embodiment transfers radio frequency signals for 5G NR and radio frequency signals for 4G LTE.

For example, acoustic wave filter 11A and LC filter 12A have a passband that is n79 of NR, and acoustic wave filter 11B and LC filter 12B have a passband that is n77 of NR. Further, low-noise amplifier 21A has amplification characteristics for amplifying radio frequency signals in n79, low-noise amplifier 21B1 has amplification characteristics for amplifying radio frequency signals in n77, and low-noise amplifier 21B2 has amplification characteristics for amplifying a radio frequency signal in B42. It should be noted that the frequency range of n77 encompasses the frequency range of B42.

In the above example of usage, putting common terminal 14a and selection terminal 14b1 into the connection state and putting common terminal 14a and selection terminal 14b2 into the connection state enable simultaneous reception (EN-DC) of signals in n77 of 5G NR and B42 of 4G LTE that have the frequency ranges in an encompassing relationship.

6. Passing Characteristics of Radio Frequency Circuit 8 According to Variation Embodiment 3

Figure 3C:
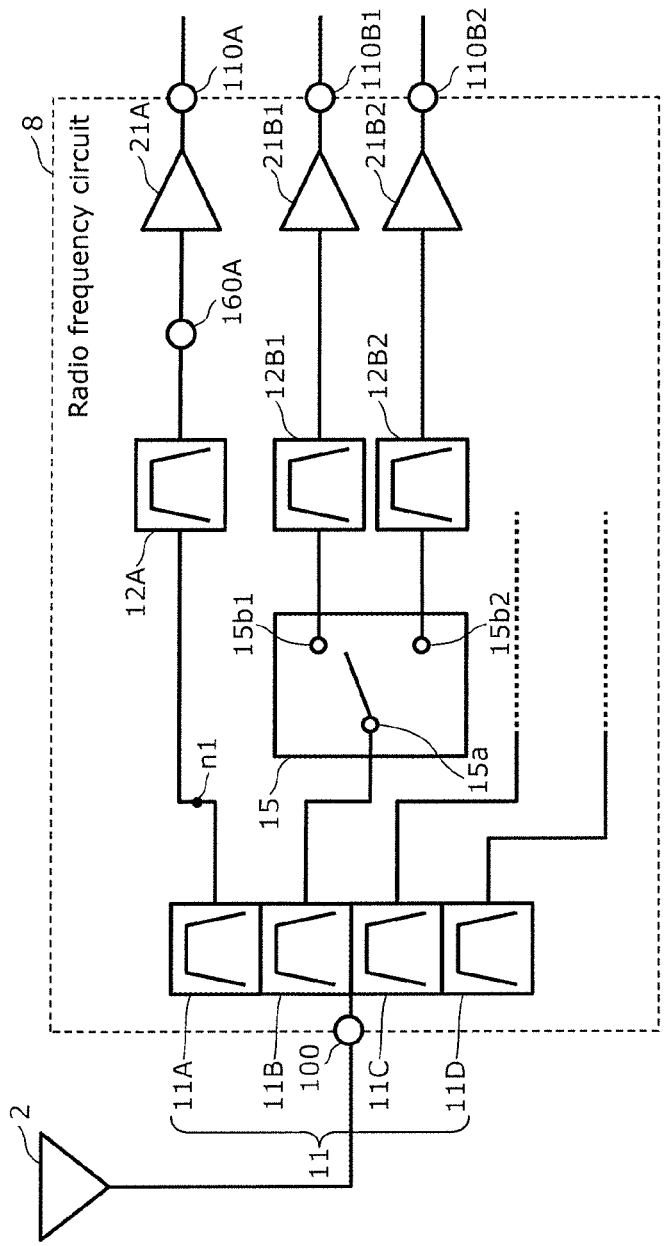
FIG. 3C is an example of a circuit configuration diagram illustrating a radio frequency circuit and an antenna element according to Variation embodiment 3 of the embodiment.

FIG. 3C is a circuit configuration diagram illustrating radio frequency circuit 8 and antenna element 2 according to Variation embodiment 3 of the embodiment. As illustrated in FIG. 3C, radio frequency circuit 8 according to the present variation includes common terminal 100, multiplexer 11, LC filters 12A, 12B1, and 12B2, switch circuit 15, low-noise amplifiers 21A, 21B1, and 21B2, and reception output terminals 110A, 110B1, and 110B2.

Radio frequency circuit 8 according to the present variation embodiment differs from radio frequency circuit 1 according to the present embodiment in that low-noise amplifiers 21B1 and 21B2 are disposed in place of low-noise amplifier 21B, LC filters 12B1 and 12B2 are disposed in place of LC filter 12B, and switch circuit 15 is added. In what follows, a description of similarities in configuration between radio frequency circuit 8 according to the present variation embodiment and radio frequency circuit 1 according to the present embodiment is omitted, and differences in configuration therebetween are mainly described.

LC filter 12A is an example of the first LC filter. Specifically, LC filter 12A is a radio frequency filter that has an input terminal connected to the output terminal of acoustic wave filter 11A via connection node n1, and an output terminal connected to terminal 160A, and that includes at least one of an inductor or a capacitor. LC filter 12A has a passband that is communication band A.

LC filter 12B1 is an example of the second LC filter. Specifically, LC filter 12B1 is a radio frequency filter that has an input terminal connected to the output terminal of acoustic wave filter 11B via switch circuit 15, and an output terminal connected to the input terminal of low-noise amplifier 21B1, and that includes at least one of an inductor or a capacitor. LC filter 12B1 has a passband that is communication band B1.

LC filter 12B2 is an example of the second LC filter. Specifically, LC filter 12B2 is a radio frequency filter that has an input terminal connected to the output terminal of acoustic wave filter 11B via switch circuit 15, and an output terminal connected to the input terminal of low-noise amplifier 21B2, and that includes at least one of an inductor or a capacitor. LC filter 12B2 has a passband that is communication band B2.

Low-noise amplifier 21A is an example of the first amplifier, and has an input terminal connected to the output terminal of LC filter 12A via terminal 160A, and an output terminal connected to reception output terminal 110A. Low-noise amplifier 21A amplifies a received radio frequency signal in communication band A that has been inputted from common terminal 100 and has passed through acoustic wave filter 11A and LC filter 12A, and outputs the amplified radio frequency signal to RFIC 3.

Low-noise amplifier 21B1 is an example of the second amplifier, and has an input terminal connected to the output terminal of LC filter 12B1, and an output terminal connected to reception output terminal 110B1. Low-noise amplifier 21B1 amplifies a received radio frequency signal in communication band B1 that has been inputted from common terminal 100 and has passed through acoustic wave filter 11B and LC filter 12B1, and outputs the amplified radio frequency signal to RFIC 3.

Low-noise amplifier 21B2 is an example of the second amplifier, and has an input terminal connected to the output terminal of LC filter 12B2, and an output terminal connected to reception output terminal 110B2. Low-noise amplifier 21B2 amplifies a received radio frequency signal in communication band B2 that has been inputted from common terminal 100 and has passed through acoustic wave filter 11B and LC filter 12B2, and outputs the amplified radio frequency signal to RFIC 3.

The series circuit of acoustic wave filter 11A and LC filter 12A passes radio frequency signals in communication band A. A series circuit including acoustic wave filter 11B and LC filter 12B1 connected via switch circuit 15 passes radio frequency signals in communication band B1. A series circuit including acoustic wave filter 11B and LC filter 12B2 connected via switch circuit 15 passes radio frequency signals in communication band B2.

Switch circuit 15 includes common terminal 15a and selection terminals 15b1 and 15b2, switches between making a connection and making a disconnection between acoustic wave filter 11B and LC filter 12B1, and switches between making a connection and making a disconnection between acoustic wave filter 11B and LC filter 12B2. Switch circuit 15 is, for example, an SPST switch.

According to the above configuration, putting common terminal 15a and selection terminal 15b1 into the connection state enables simultaneous reception of signals in communication band A and communication band B1, and putting common terminal 15a and selection terminal 15b2 into the connection state enables simultaneous reception of signals in communication band A and communication band B2. Moreover, since low-noise amplifiers 21B1 and 21B2 amplify the radio frequency signal in communication band B1 and the radio frequency signal in communication band B2, respectively, it is possible to set the amplification characteristics of low-noise amplifiers 21B1 and 21B2 exclusively for respective communication bands B1 and B2. Accordingly, it is possible to enhance performance regarding the gain, distortion characteristics, and power consumption of low-noise amplifiers 21B1 and 21B2.

Furthermore, radio frequency circuit 8 according to the present variation transfers radio frequency signals for 5G NR and radio frequency signals for 4G LTE.

For example, acoustic wave filter 11A and LC filter 12A have a passband that is n79 of NR, LC filter 12B1 has a passband that is n77 of NR, and LC filter 12B2 has a passband that is n78 of NR. For this reason, acoustic wave filter 11B has n77 and n78 of NR as passbands. Low-noise amplifier 21A has amplification characteristics for amplifying radio frequency signals in n79 of NR, low-noise amplifier 21B1 has amplification characteristics for amplifying radio frequency signals in n77 of NR, and low-noise amplifier 21B2 has amplification characteristics for amplifying radio frequency signals in n78 of NR. It should be noted that the frequency range of n78 of NR encompasses the frequency ranges of B42, B43, and B49 of LTE.

In the above example of usage, putting common terminal 15a and selection terminal 15b2 into the connection state enables simultaneous reception (EN-DC) of signals in n79 of 5G NR and B42, B43, B48, or B49 of 4G LTE.

7. Structure of Acoustic Wave Filter and LC Filter

Figure 4A:
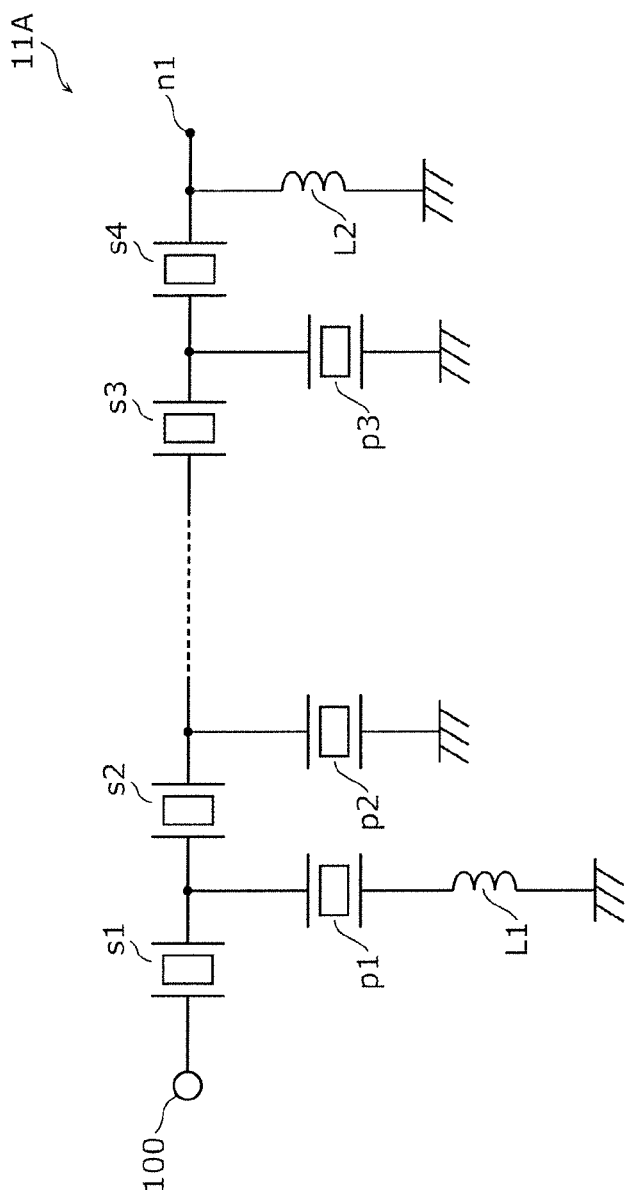
FIG. 4A is a diagram illustrating the first example of a circuit configuration of an acoustic wave filter according to the embodiment.

FIG. 4A is a diagram illustrating the first example of a circuit configuration of acoustic wave filter 11A according to the embodiment. As illustrated in FIG. 4A, acoustic wave filter 11A includes series-arm resonators s1, s2, s3, and s4, parallel-arm resonators p1, p2, and p3, and inductors L1 and L2.

Series-arm resonators s1 to s4 are each an example of the first acoustic wave resonator, and are arranged in series on a path connecting common terminal 100 and connection node n1. Parallel-arm resonators p1 to p3 are each an example of the first acoustic wave resonator, and are disposed between ground and nodes on the path connecting series-arm resonators s1 to s4 and connection node n 1.

Series-arm resonators s1 to s4 and parallel-arm resonators p1 to p3 each have a resonant frequency that causes impedance to have a local minimum, and an antiresonant frequency that causes an impedance to have a local maximum.

A passband of acoustic wave filter 11A is determined by substantially matching the antiresonant frequencies of parallel-arm resonators p1 to p3 and the resonant frequencies of series-arm resonators s1 to s4. It should be noted that there may be any number of series-arm resonators and any number of parallel-arm resonators. In other words, acoustic wave filter 11A is configured as a ladder bandpass filter including acoustic wave resonators. It should be noted that acoustic wave filter 11A is not limited to the ladder bandpass filter, and may be a longitudinally coupled filter.

Inductor L1 is connected between parallel-arm resonator p1 and the ground, and is a passive element for adjusting an attenuation pole in an attenuation band of acoustic wave filter 11A. Inductor L2 is connected between connection node n1 and the ground, and is a passive element for adjusting an attenuation pole in an attenuation band of acoustic wave filter 11A or for performing impedance matching between a circuit element connected to connection node n1 and acoustic wave filter 11A. It should be noted that a capacitor may be disposed in place of inductors L1 and L2, and further both an inductor and a capacitor may be disposed in place of the same.

In other words, the passband of acoustic wave filter 11A in the present variation embodiment is determined by only parallel-arm resonators p1 to p3 and series-arm resonators s1 to s4. In contrast, the attenuation band of acoustic wave filter 11A in the present variation embodiment is determined by parallel-arm resonators p1 to p3, series-arm resonators s1 to s4, and inductors L1 and L2.

The above structure enables miniaturization and reduction in cost of multiplexer 11 including acoustic wave filter 11A.

It should be noted that in acoustic wave filter 11A in the present variation, a switch may be connected to at least one of the acoustic wave resonators or inductors L1 and L2. In this case, for example, by switching the switch according to a switch of a communication band to be used, it is possible to change the passband of acoustic wave filter 11A.

Moreover, acoustic wave filter 11A in the present variation embodiment does not necessarily need include inductors L1 and L2, and may include only the acoustic wave resonators.

Furthermore, acoustic wave filters 11B to 11D may each have the structure of the present variation. Since the structure of acoustic wave filters 11A to 11D enables multiplexer 11 to be integrated into one piezoelectric substrate, the miniaturization is promoted.

Figure 4B:
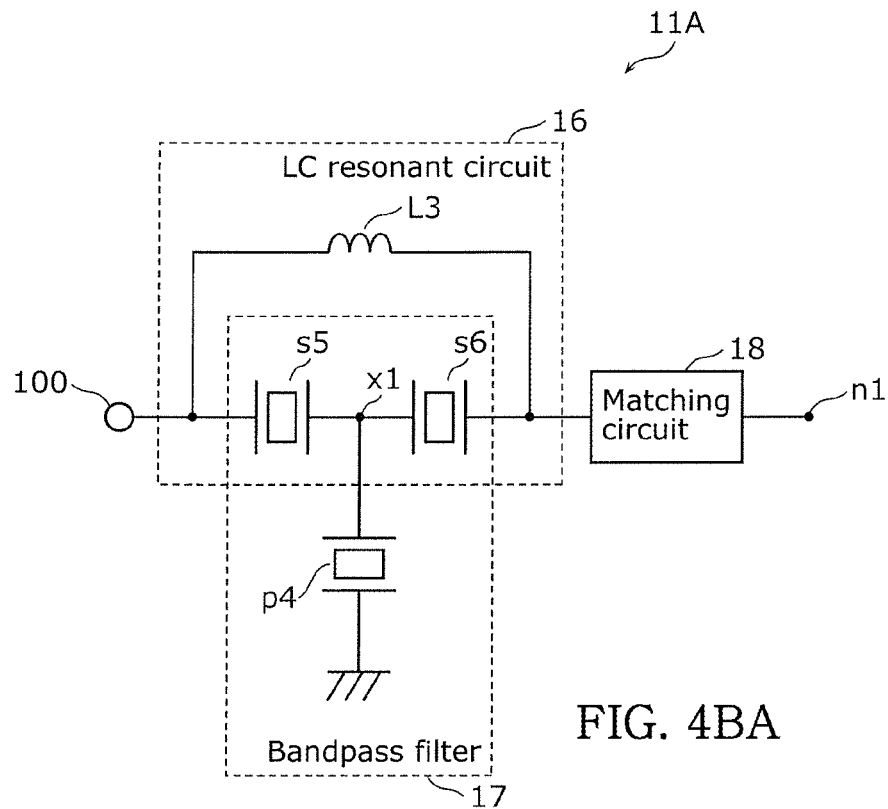
FIG. 4BA is a diagram illustrating the second example of a circuit configuration and FIG. 4BB is an example graph diagram showing passing characteristics of an acoustic wave filter according to the embodiment.
Figure 4B:
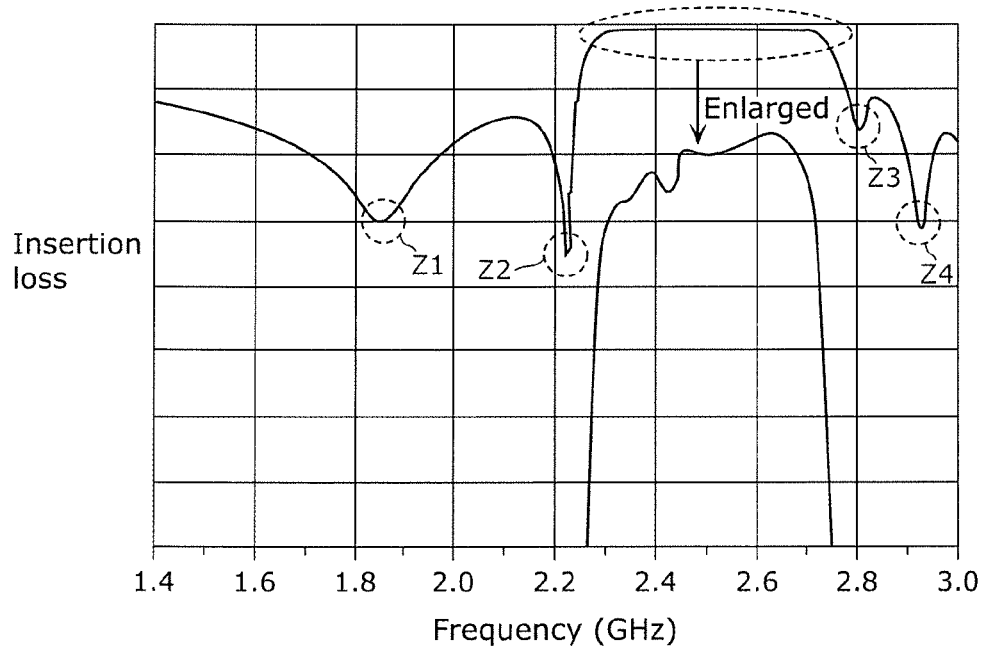

FIG. 4BA is a diagram illustrating the second example of a circuit configuration and FIG. 4BB is an example graph diagram showing passing characteristics of acoustic wave filter 11A according to the embodiment. FIG. 4BA illustrates a circuit configuration of acoustic wave filter 11A in the present variation embodiment (as shown in the upper part), and passing characteristics of acoustic wave filter 11A in the present variation embodiment (as shown in the bottom part). As shown in FIG. 4BA, acoustic wave filter 11A includes series-arm resonators s5 and s6, parallel-arm resonator p4, inductor L3, and matching circuit 18.

Series-arm resonators s5 and s6 are connected in series between common terminal 100 and connection node n1.

Parallel-arm resonator p4 is connected between the ground and connection node x1 between series-arm resonators s5 and s6.

Inductor L3 is connected between a connection node between series-arm resonator s5 and common terminal 100 and a connection node between series-arm resonator s6 and matching circuit 18. Matching circuit 18 is connected between series-arm resonator s6 and connection node n1.

Series-arm resonators s5 and s6 and inductor L3 constitute LC resonant circuit 16. Further, series-arm resonators s5 and s6 and parallel-arm resonator p4 determine a passband of bandpass filter 17.

In the FIG. 4BB, attenuation pole Z2 corresponds to a resonant frequency of parallel-arm resonator p4, attenuation pole Z3 corresponds to an antiresonant frequency of series-arm resonator s5, and attenuation pole Z4 corresponds to an antiresonant frequency of series-arm resonator s6. Series-arm resonators s5 and s6 and parallel-arm resonator p4 operate as a notch filter. Attenuation pole Z2 and attenuation poles Z3 and Z4 form a low-frequency side attenuation slope and a high-frequency side attenuation slope of the passband of acoustic wave filter 11A, respectively. A passband of LC resonant circuit 16 has, for example, a fractional bandwidth of at least 4.5%, and ranges from a frequency corresponding to attenuation pole Z2 to a frequency corresponding to attenuation pole Z4. However, since the antiresonant frequency of each of series-arm resonators s5 and s6 and the resonant frequency of parallel-arm resonator p4 are located in the passband, the passband is locally attenuated. It should be noted that since series-arm resonators s5 and s6 and parallel-arm resonator p4 each are an acoustic wave resonator, the attenuation slopes of these are steep. Here, by locating attenuation pole Z2 and attenuation poles Z3 and Z4 away from each other (i.e., locating the anti-resonant frequencies of series-arm resonators s5 and s6 and the resonant frequency of parallel-arm resonator p4 away from each other), acoustic wave filter 11A can be used as a bandpass filter having passing characteristics in which a passband is wide. It should be noted that a wide passband has, for example, a fractional bandwidth of at least 4.5%, and desirably a fractional bandwidth of at least 7.5%. Further, LC resonant circuit 16 has a lower resonant frequency than parallel-arm resonator p4. Attenuation pole Z1 corresponds to a resonant frequency of LC resonant circuit 16. Accordingly, it is possible to increase the width of an attenuation band lower than the passband of acoustic wave filter 11A. It should be noted that, by adjusting an inductance value of inductor L3, it is possible to adjust the resonant frequency of LC resonant circuit 16, and locate the attenuation poles of LC resonant circuit 16 away from the passband of acoustic wave filter 11A.

In other words, acoustic wave filter 11A in the present variation embodiment may include at least one of an inductor or a capacitor in addition to the acoustic wave resonators. According to this configuration, a passband is determined by LC resonant circuit 16, and attenuation poles defining the bandwidth of the passband are determined by the acoustic wave resonators. In addition, an attenuation pole in an attenuation band away from the passband is determined by LC resonant circuit 16. As a result, it is possible to achieve a wide and low-loss passband, and steeply attenuate a neighborhood of the passband.

It should be noted that in acoustic wave filter 11A in the present variation embodiment, a switch may be disposed in at least one of LC resonant circuit 16 or bandpass filter 17. In this case, for example, by switching the switch according to a switch of a communication band to be used, it is possible to change the passband of acoustic wave filter 11A.

Furthermore, acoustic wave filters 11B to 11D may each have the structure of the present variation embodiment.

Figure 4C:
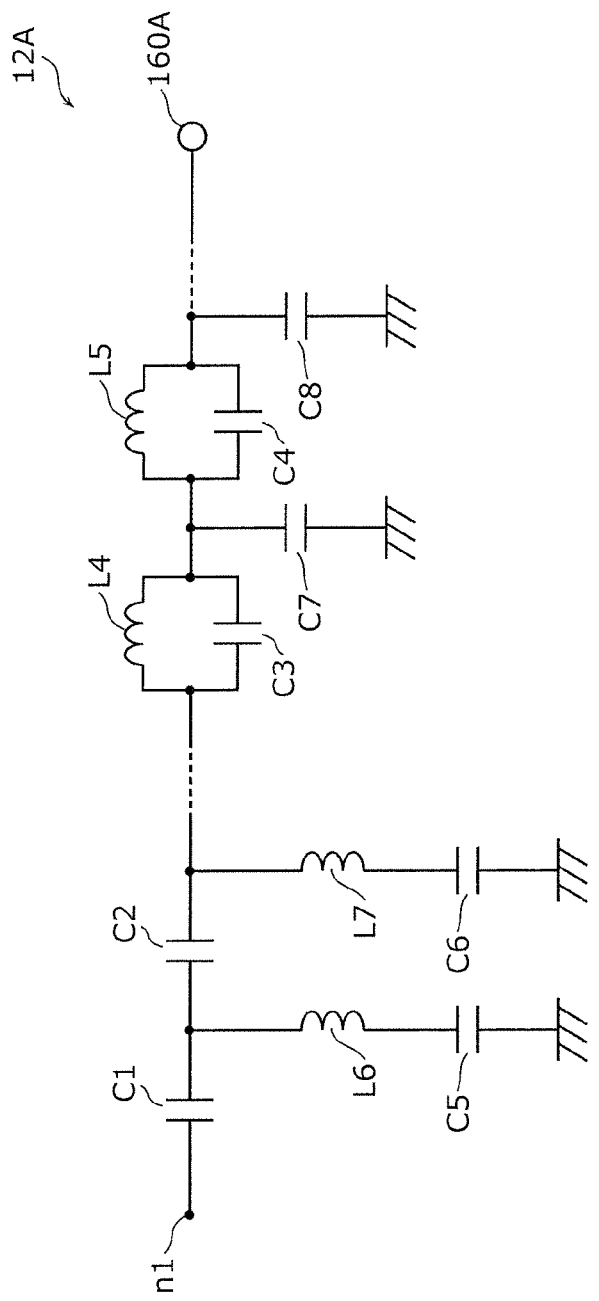
FIG. 4C is a diagram illustrating an example of a circuit configuration of the LC filter according to the embodiment.

FIG. 4C is a diagram illustrating an example of a circuit configuration of LC filter 12A according to the embodiment. As illustrated in FIG. 4C, LC filter 12A includes capacitors C1, C2, C3, C4, C5, C6, C7, and C8 and inductors L4, L5, L6, and L7.

Capacitor C1, capacitor C2, a parallel circuit of inductor L4 and capacitor C3, and a parallel circuit of inductor L5 and capacitor C4 are connected in series on a path connecting connection node n1 and terminal 160A. A series circuit of inductor L6 and capacitor C5, a series circuit of inductor L7 and capacitor C6, capacitor C7, and capacitor C8 are disposed between ground and nodes on the path connecting connection node n1 and terminal 160A.

Inductor L4 and capacitor C3 constitute an LC parallel resonant circuit. Inductor L5 and capacitor C4 constitute an LC parallel resonant circuit. Inductor L6 and capacitor C5 constitute an LC series resonant circuit. Inductor L7 and capacitor C6 constitute an LC series resonant circuit.

A passband and an attenuation band of LC filter 12A are determined by adjusting resonant frequencies of the LC parallel resonant circuits and resonant frequencies of the LC series resonant circuits. It should be noted that although there may be any number of inductors and capacitors and any connection relationship between those, it is desirable that LC filter 12A include at least one of the LC parallel resonant circuits or the LC series resonant circuits. In consequence, since it is possible to use an LC series resonant frequency or an LC parallel resonant frequency as an attenuation pole, it is possible to achieve a wider attenuation band.

It should be noted that in LC filter 12A in the present variation embodiment, a switch may be connected to at least one of an inductor or a capacitor. In this case, for example, by switching the switch according to a switch of a communication band to be used, it is possible to change the passband of LC filter 12A.

It should be noted that in the radio frequency circuit according to each of the present embodiment and variations thereof, an impedance in the passband of acoustic wave filter 11A seen from connection node n1 (an output impedance in the passband of acoustic wave filter 11A) and an impedance in the passband of LC filter 12A seen from connection node n1 (an input impedance in the passband of LC filter 12A) may be matched at non-50Ω.

When the output impedance of acoustic wave filter 11A has an impedance value of non-50Ω, since the input impedance of LC filter 12A is approximately the same as the impedance value, it is not necessary to dispose an impedance-matching circuit between acoustic wave filter 11A and LC filter 12A.

Accordingly, it is possible to achieve the low loss in the passband for the radio frequency signal passing through acoustic wave filter 11A and LC filter 12A and the high attenuation in the attenuation band while simplifying the impedance-matching element disposed between acoustic wave filter 11A and LC filter 12A.

It should be noted that in radio frequency circuit 1 according to the present embodiment, an impedance in the passband of acoustic wave filter 11B seen from connection node n2 (an output impedance in the passband of acoustic wave filter 11B) and an impedance in the passband of LC filter 12B seen from connection node n2 (an input impedance in the passband of LC filter 12B) may be matched at non-50Ω.

FIG. 5 is an example of a circuit configuration diagram illustrating a neighborhood of connection node n1 between acoustic wave filter 11A and LC filter 12A of the radio frequency circuit according to the embodiment. As illustrated in FIG. 5, when acoustic wave filter 11A includes one or more series-arm resonators and one or more parallel-arm resonators, among the one or more series-arm resonators and the one or more parallel-arm resonators, series-arm resonator s170 may be connected closest to connection node n1. In contrast, among inductors and capacitors included in LC filter 12A, capacitor C170 may be connected in series to series-arm resonator s170 via connection node n1. In other words, series-arm resonator s170 and capacitor C170 may be connected in series via connection node n1.

Accordingly, an output impedance of acoustic wave filter 11A becomes capacitive, and so does an input impedance of LC filter 12A. Consequently, it is possible to easily match an impedance of acoustic wave filter 11A with an impedance of LC filter 12A, using a few number of impedance-matching elements with capacitive impedance.

It should be noted that when acoustic wave filter 11A and LC filter 12A are impedance-matched at non-50Ω, acoustic wave filter 11A and LC filter 12A may be disposed on the same substrate. When acoustic wave filter 11A and LC filter 12A are impedance-matched at non-50Ω, it is not necessary to dispose an impedance-matching element between acoustic wave filter 11A and LC filter 12A. Accordingly, since acoustic wave filter 11A and LC filter 12A can be connected directly, it is easy to dispose these filters on the same substrate, which promotes the miniaturization of radio frequency circuit 1.

Moreover, when acoustic wave filter 11A includes one or more series-arm resonators and one or more parallel-arm resonators, among the one or more series-arm resonators and the one or more parallel-arm resonators, a parallel-arm resonator may be connected closest to connection node n1. In contrast, among inductors and capacitors included in LC filter 12A, a capacitor may be connected between connection node n1 and ground, and may be connected closest to connection node n1.

Accordingly, it is possible to easily match an impedance of acoustic wave filter 11A with an impedance of LC filter 12A, using a few number of impedance-matching elements with capacitive impedance.

8. Example of Passing Characteristics of Radio Frequency Circuit 1

FIG. 6A is an example of a circuit configuration diagram in which radio frequency circuit 1 according to the embodiment is used for communication bands of 4G LTE and 5G NR, and graphs showing passing characteristics. FIG. 6A shows a circuit configured as radio frequency module 10 included in radio frequency circuit 1. Acoustic wave filter 11A and LC filter 12A have a passband that is n79 of NR, and acoustic wave filter 11B and LC filter 12B have a passband that is n77 of NR encompassing n78 of NR and B42, B43, B48, and B49 of LTE. FIG. 6B shows passing characteristics of acoustic wave filter 11B, FIG. 6C shows passing characteristics of LC filter 12B, and FIG. 6D shows passing characteristics of a series circuit of acoustic wave filter 11B and LC filter 12B.

As shown in FIG. 6B, in the passing characteristics of acoustic wave filter 11B, (1) there is low loss within the passband (3300 to 4200 MHz), and (2) since attenuation slopes at both ends of the passband are steep, a large amount of attenuation in attenuation bands in a neighborhood of the passband is ensured. On the other hand, (3) there is an attenuation band (a band in which attenuation rebounds) with an amount of attenuation that decreases with distance from the passband toward the high-frequency side due to a rebound of high attenuation in the neighborhood of the passband.

In contrast, as shown in FIG. 6B, in the passing characteristics of LC filter 12B, (1) since attenuation slopes at both ends of the passband (3300 to 4200 MHz) are gentle, an amount of attenuation in an attenuation band in a neighborhood of the passband is small, compared to the passing characteristics of acoustic wave filter 11B. On the other hand, (2) there is low loss within the passband, (3) the passband width is relatively wide, and (4) wide and stable attenuation are ensured in an attenuation band away from the passband.

In contrast, as shown in FIG. 6C, in the passing characteristics of the series circuit of acoustic wave filter 11B and LC filter 12B, high attenuation in a neighborhood of the passband strongly reflects the passing characteristics of acoustic wave filter 11B, high attenuation on the high-frequency side away from the passband strongly reflects the passing characteristics of LC filter 12B, and wide and stable attenuation is ensured.

In other words, connecting acoustic wave filter 11B and LC filter 12B in series enables the series circuit to have passing characteristics in which low loss in a wide passband of 900 MHz, high attenuation in the neighborhood of the passband, and high attenuation in a band away from the passband are ensured.

Moreover, a series circuit of acoustic wave filter 11A and LC filter 12A is also capable of having passing characteristics in which low loss in a wide passband (e.g., a pass band from 4400 MHz to 5000 MHz: a bandwidth of 600 MHz) that is n79 of NR, high attenuation in the neighborhood of the passband, and high attenuation in a band away from the passband are ensured.

The radio frequency circuit according to each of the present embodiment and variations thereof makes it possible to transfer signals in communication bands of 5G NR with high isolation and low loss, and further transfer signals in the communication bands of 5G NR and communication bands of 4G LTE with high isolation and low loss.

Figure 7:
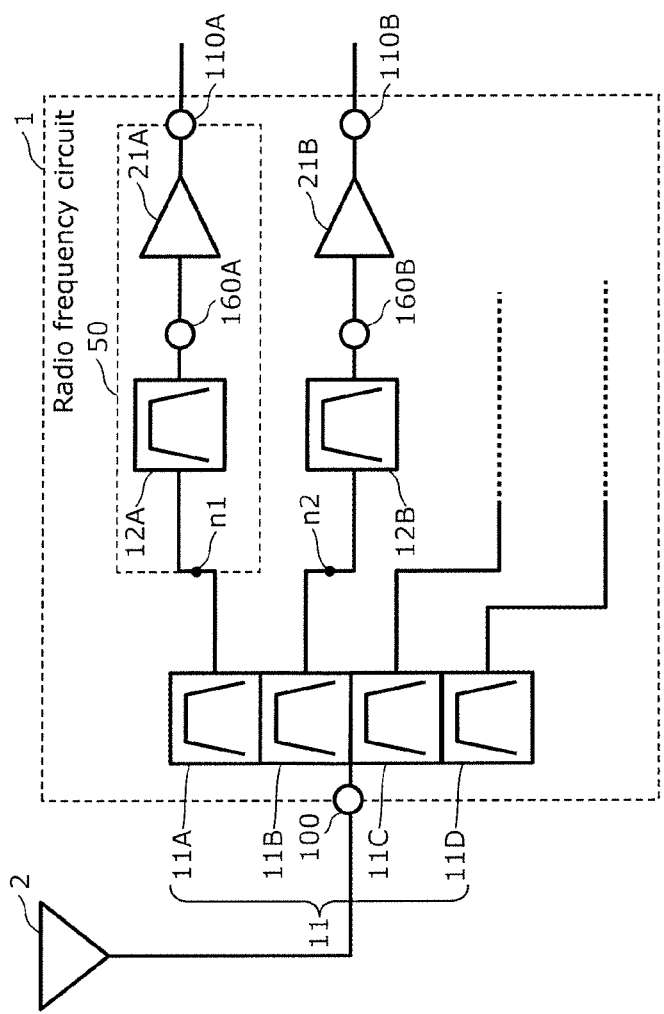
FIG. 7 is an example of a circuit configuration diagram illustrating a radio frequency circuit according to Variation embodiment 4 of the embodiment, and peripheral circuitry of the radio frequency circuit.

9. Configuration of Radio Frequency Circuit According to Variation Embodiment FIG. 7 is a circuit configuration diagram illustrating a radio frequency circuit according to Variation embodiment 4 of the embodiment, and peripheral circuitry thereof. The radio frequency circuit according to the present variation embodiment does not necessarily include common terminal 100, multiplexer 11, LC filter 12B, and low-noise amplifier 21B, compared to radio frequency circuit 1 according to the embodiment.

In other words, the radio frequency circuit according to the present variation embodiment includes LC filter 12A and low-noise amplifier 21A.

LC filter 12A is an example of the first LC filter, and is a high frequency filter that has an output terminal connected to an input terminal of low-noise amplifier 21A and includes at least one of an inductor or a capacitor. It should be noted that LC filter 12A includes no acoustic wave resonator.

Low-noise amplifier 21A is an example of a first low-noise amplifier, and has an input terminal connected to the output terminal of LC filter 12A via terminal 160A.

According to the above configuration, since the input terminal of low-noise amplifier 21A is connected to LC filter 12A having a wide attenuation band, a radio frequency signal from which unwanted wide-band components have been removed is inputted to low-noise amplifier 21A. As a result, it is possible to greatly increase the S/N ratio of the radio frequency signal outputted from low-noise amplifier 21A.

The radio frequency circuit according to the present variation embodiment may further include LC filter 12B and low-noise amplifier 21B.

LC filter 12B is an example of the second LC filter, and is a high frequency filter that has an output terminal connected to an input terminal of low-noise amplifier 21B and includes at least one of an inductor or a capacitor. It should be noted that LC filter 12B includes no acoustic wave resonator.

Low-noise amplifier 21B is an example of a second low-noise amplifier, and has an input terminal connected to the output terminal of LC filter 12B via terminal 160B.

Further, the input terminal of LC filter 12A and the input terminal of LC filter 12B are connected to multiplexer 11 that demultiplexes a radio frequency signal from antenna element 2.

Accordingly, unwanted wide-band components are removed from a radio frequency signal to be outputted from multiplexer 11, and the radio frequency signal is demultiplexed and inputted to low-noise amplifiers 21A and 21B. As a result, it is possible to greatly increase the S/N ratio of the radio frequency signal outputted from low-noise amplifier 21A and the S/N ratio of the radio frequency signal outputted from low-noise amplifier 21B.

The radio frequency circuit according to the present variation embodiment may further include acoustic wave filter 11A.

Acoustic wave filter 11A is an example of the first acoustic wave filter, and is a radio frequency filter that has an output terminal connected to the input terminal of LC filter 12A via connection node n1 and includes the first acoustic wave resonator. The first acoustic wave resonator is, for example, an acoustic wave resonator that uses SAWs or BAWs.

Accordingly, since acoustic wave filter 11A capable of highly attenuating the neighborhood of the passband due to the steep attenuation slopes at both ends of the passband is connected to the front end of LC filter 12A, the radio frequency signal from which unwanted wide-band components and unwanted components of the neighborhood of the passband have been removed is inputted to low-noise amplifier 21A. As a result, it is possible to greatly increase the S/N ratio of the radio frequency signal outputted from low-noise amplifier 21A.

It should be noted that LC filter 12A and low-noise amplifier 21A may be disposed on the same substrate and constitute radio frequency module 50. Moreover, LC filters 12A and 12B and low-noise amplifiers 21A and 21B may be disposed on the same substrate and constitute radio frequency module 50. Accordingly, it is possible to achieve a small radio frequency circuit.

10. Advantageous Effects, Etc

As described above, according to the present embodiment, radio frequency circuit 1 includes acoustic wave filter 11A that is connected to common terminal 100 and includes a first acoustic wave resonator, LC filter 12A that is connected to common terminal 100 via acoustic wave filter 11A and includes at least one of an inductor or a capacitor, acoustic wave filter 11B that is connected to common terminal 100 and includes a second acoustic wave resonator, and LC filter 12B that is connected to common terminal 100 via the second acoustic wave filter and includes at least one of an inductor or a capacitor.

With this configuration, the acoustic wave filters used as multiplexer 11 connected to common terminal 100 make it possible to demultiplex signals in communication bands adjacent to a passband with high isolation, and highly attenuate neighboring bands of the passband. Further, LC filter 12A connected to acoustic wave filter 11A and LC filter 12B connected to acoustic wave filter 11B make it possible to highly attenuate bands away from the passband. Accordingly, it is possible to demultiplex radio frequency signals in communication bands with high isolation and low loss.

Moreover, according to the present embodiment, radio frequency circuit 1 may further include: low-noise amplifier 21A that is connected to LC filter 12A and amplifies a radio frequency signal; and low-noise amplifier 21B that is connected to LC filter 12B and amplifies a radio frequency signal.

With this configuration, it is possible to demultiplex and amplify a radio frequency signal inputted from common terminal 100.

Moreover, according to Variation embodiment 1 of the present embodiment, radio frequency circuit 6 may further include switch circuit 13. Switch circuit 13 includes: switch 13A that is disposed between acoustic wave filter 11A and LC filter 12A, and switches between making a connection and making a disconnection between acoustic wave filter 11A and LC filter 12A; and switch 13B that is disposed between acoustic wave filter 11B and LC filter 12B, and switches between making a connection and making a disconnection between acoustic wave filter 11B and LC filter 12B.

With this configuration, it is possible to put a first signal path on which acoustic wave filter 11A and LC filter 12A are disposed and a second signal path on which acoustic wave filter 11B and LC filter 12B are disposed, into an OFF state (a non-propagation state).

Moreover, according to the present embodiment, a passband of at least one of acoustic wave filter 11A or 11B may be determined by only an acoustic wave resonator.

With this configuration, it is possible to miniaturize and reduce the cost of radio frequency circuit 1 and communication device 5.

Moreover, according to the present embodiment, at least one of acoustic wave filter 11A or 11B may further include at least one of an inductor or a capacitor.

With this configuration, it is possible to achieve a wide and low-loss passband, and steeply attenuate an attenuation band in a neighborhood of the passband.

Moreover, according to the present embodiment, at least one of LC filter 12A or 12B may include at least one of an LC series resonant circuit or an LC parallel resonant circuit.

With this configuration, it is possible to achieve a wider attenuation band by using an LC series resonant frequency or an LC parallel resonant frequency as an attenuation pole.

Moreover, according to the present embodiment, impedance of acoustic wave filter 11A seen from an LC filter 12A side and impedance of LC filter 12A seen from an acoustic wave filter 11A side may be matched at non-50Ω.

With this configuration, it is possible to achieve low loss in a passband for a radio frequency signal passing through acoustic wave filter 11A and LC filter 12A and high attenuation in an attenuation band while simplifying an impedance-matching element disposed between acoustic wave filter 11A and LC filter 12A.

Moreover, according to the present embodiment, acoustic wave filter 11A may include: one or more series-arm resonators that are connected in series on a path connecting an input terminal and an output terminal of acoustic wave filter 11A; and one or more parallel-arm resonators that are connected between the path and ground. Among the one or more series-arm resonators and the one or more parallel-arm resonators, a series-arm resonator may be connected closest to LC filter 12A. Out of an inductor and a capacitor included in LC filter 12A, the capacitor may be connected closest to acoustic wave filter 11A.

With this configuration, it is possible to easily achieve impedance matching between capacitive acoustic wave filter 11A and LC filter 12A using a few number of impedance-matching elements.

Moreover, according to the present embodiment, acoustic wave filter 11A may include: one or more series-arm resonators that are connected in series on a path connecting an input terminal and an output terminal of acoustic wave filter 11A; and one or more parallel-arm resonators that are connected between the path and ground. Among the one or more series-arm resonators and the one or more parallel-arm resonators, a parallel-arm resonator may be connected closest to LC filter 12A. Out of an inductor and a capacitor included in LC filter 12A, the capacitor may be connected between the ground and a path connecting an input terminal and an output terminal of LC filter 12A, and may be connected closest to acoustic wave filter 11A.

With this configuration, it is possible to easily achieve impedance matching between capacitive acoustic wave filter 11A and LC filter 12A using a few number of impedance-matching elements.

Moreover, according to the present embodiment, acoustic wave filter 11A and LC filter 12A may be disposed on a same substrate.

With this configuration, it is easy to perform impedance matching between acoustic wave filter 11A and LC filter 12A while miniaturizing radio frequency circuit 1.

Moreover, according to the present embodiment, acoustic wave filters 11A and 12A and LC filters 12A and 12B may be disposed on a same substrate.

With this configuration, it is possible to miniaturize radio frequency circuit 1.

Moreover, according to the present embodiment, one of acoustic wave filters 11A and 11B may have a passband that is n79 of NR, and the other of acoustic wave filters 11A and 11B may have a passband that is at least one of n77 of NR, n78 of NR, B42 of LTE, B43 of LTE, B48 of LTE, or B49 of LTE.

With this configuration, it is possible to transfer signals in communication bands of 5G NR with high isolation and low loss, and further transfer signals in the communication bands of 5G NR and communication bands of 4G LTE with high isolation and low loss.

Moreover, according to Variation embodiment 1 of the present embodiment, the radio frequency circuit includes: LC filter 12A that includes no acoustic wave resonator and includes at least one of an inductor or a capacitor; and low-noise amplifier 21A that amplifies a radio frequency signal. LC filter 12A has an output terminal connected to an input terminal of low-noise amplifier 21A.

With this configuration, since the input terminal of low-noise amplifier 21A is connected to LC filter 12A having a wide attenuation band, a radio frequency signal from which unwanted wide-band components have been removed is inputted to low-noise amplifier 21A. As a result, it is possible to greatly increase the S/N ratio of the radio frequency signal outputted from low-noise amplifier 21A.

Moreover, according to Variation embodiment 1 of the present embodiment, the radio frequency circuit may further include: LC filter 12B that includes no acoustic wave resonator and includes at least one of an inductor or a capacitor; and low-noise amplifier 21B that amplifies a radio frequency signal. LC filter 12B may have an output terminal connected to an input terminal of low-noise amplifier 21B. LC filter 12A and LC filter 12B may each have an input terminal connected to multiplexer 11 that demultiplexes a radio frequency signal from antenna element 2.

With this configuration, unwanted wide-band components are removed from a radio frequency signal to be outputted from multiplexer 11, and the radio frequency signal is demultiplexed and inputted to low-noise amplifiers 21A and 21B. As a result, it is possible to greatly increase the S/N ratio of the radio frequency signal outputted from low-noise amplifier 21A and the S/N ratio of the radio frequency signal outputted from low-noise amplifier 21B.

Moreover, according to Variation embodiment 1 of the present embodiment, the radio frequency circuit may further include acoustic wave filter 11A that includes a first acoustic wave resonator. LC filter 12A may have an input terminal connected to an output terminal of acoustic wave filter 11A.

With this configuration, since acoustic wave filter 11A capable of steeply attenuating a neighboring band of a passband is connected to the front end of LC filter 12A, a radio frequency signal from which unwanted wide-band components and unwanted components of a neighborhood of the passband have been removed is inputted to low-noise amplifier 21A. As a result, it is possible to greatly increase the S/N ratio of the radio frequency signal outputted from low-noise amplifier 21A.

Moreover, according to the present embodiment, communication device 5 includes RFIC 3 that processes a radio frequency signal received by antenna element 2, and radio frequency circuit 1 that transfers the radio frequency signal between antenna element 2 and RFIC 3.

With this configuration, it is possible to provide a communication device that demultiplexes radio frequency signals in communication bands with high isolation and low loss.

Other Embodiments

Although the radio frequency circuit and the communication device according to the present disclosure have been described using the embodiment and the variation embodiments, the present disclosure is not limited to the afore-mentioned embodiment and variation embodiments. The present disclosure contains other embodiments realized by combining any elements in the afore-mentioned embodiment and variation embodiments, variation embodiments obtained by making various modifications to the afore-mentioned embodiment and variations that can be conceived by a person with an ordinary skill in the art without departing from the scope of the present disclosure, and various devices that include the radio frequency circuit and the communication device according to the present disclosure.

For example, in the radio frequency circuit and the communication device according to each of the embodiment and the variation embodiments, matching elements such as inductors and capacitors, and switch circuits may be connected between the elements. Note that the inductor may include a line inductor achieved by a line that connects elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The embodiments according to the present disclosure can be widely used in communication apparatuses such as mobile phones, as radio frequency circuits and communication devices that can be used in multi-band systems.

The invention claimed is:

1. A radio frequency circuit, comprising:
   a substrate;
   a common terminal;
   a first acoustic wave filter that is disposed on the substrate, is connected to the common terminal, and includes a first acoustic wave resonator;
   a first LC filter that is disposed on the substrate, is connected to the common terminal via the first acoustic wave filter, and includes at least one of an inductor or a capacitor;
   a second acoustic wave filter that is disposed on the substrate, is connected to the common terminal, and includes a second acoustic wave resonator;
   a second LC filter that is disposed on the substrate, is connected to the common terminal via the second acoustic wave filter, and includes at least one of an inductor or a capacitor;
   a first amplifier that is connected to the first LC filter and is disposed on the substrate; and
   a second amplifier that is connected to the second LC filter and is disposed on the substrate,
   wherein (1) the first acoustic wave filter and the second acoustic wave filter have a passband that is a communication band of New Radio (NR) less than or equal to 5 GHz, or (2) the first acoustic wave filter has a passband that is a communication band of NR less than or equal to 5 GHZ and the second acoustic wave filter has a passband that is an unlicensed band of Long Term Evolution (LTE), NR, or Wireless Local Area Network (WLAN) greater than or equal to 5 GHZ, or (3) the first acoustic wave filter and the second acoustic wave filter have a passband that is an unlicensed band of LTE, NR, or WLAN greater than or equal to 5 GHz.

2. The radio frequency circuit according to claim 1, further comprising:
   a switch circuit, wherein:
   the switch circuit includes:
      a first switch that is disposed between the first acoustic wave filter and the first LC filter, and is configured to switch between making a connection and making a disconnection between the first acoustic wave filter and the first LC filter; and
      a second switch that is disposed between the second acoustic wave filter and the second LC filter, and is configured to switch between making a connection and making a disconnection between the second acoustic wave filter and the second LC filter.

3. The radio frequency circuit according to claim 1, wherein:
   the passband of at least one of the first acoustic wave filter or the second acoustic wave filter is determined by only an acoustic wave resonator.

4. The radio frequency circuit according to claim 1, wherein:
   at least one of the first acoustic wave filter or the second acoustic wave filter further includes at least one of an inductor or a capacitor.

5. The radio frequency circuit according to claim 1, wherein:
   at least one of the first LC filter or the second LC filter includes at least one of an LC series resonant circuit or an LC parallel resonant circuit.

6. The radio frequency circuit according to claim 1, wherein:
   an impedance of the first acoustic wave filter seen from a first LC filter side and an impedance of the first LC filter seen from a first acoustic wave filter side are matched at non-50 Ω.

7. The radio frequency circuit according to claim 1, wherein:
   the first acoustic wave filter includes:
      one or more series-arm resonators that are connected in series on a path connecting an input terminal and an output terminal of the first acoustic wave filter; and
      one or more parallel-arm resonators that are connected between the path and ground,
   among the one or more series-arm resonators and the one or more parallel-arm resonators, one of the series-arm resonators is connected closest to the first LC filter, and
   out of an inductor and a capacitor included in the first LC filter, the capacitor is connected closest to the first acoustic wave filter.

8. The radio frequency circuit according to claim 1, wherein:
   the first acoustic wave filter includes:
      one or more series-arm resonators that are connected in series on a path connecting an input terminal and an output terminal of the first acoustic wave filter; and
      one or more parallel-arm resonators that are connected between the path and ground,
   among the one or more series-arm resonators and the one or more parallel-arm resonators, a parallel-arm resonator is connected closest to the first LC filter, and
   out of an inductor and a capacitor included in the first LC filter, the capacitor is connected between the ground and a path connecting an input terminal and an output terminal of the first LC filter, and is connected closest to the first acoustic wave filter.

9. The radio frequency circuit according to claim 1, wherein at least one end of the first acoustic wave filter or one end of the second acoustic wave filter is directly connected to the common terminal.

10. The radio frequency circuit according to claim 1, wherein at least one of the first acoustic wave filter is directly connected to first LC filter or the second acoustic wave filter is directly connected to the second LC filter.

11. The radio frequency circuit according to claim 1, wherein at least one of the first LC filter comprises a terminal that is directly connected to the first amplifier or the second LC filter comprises a terminal that is directly connected to the second amplifier.

12. The radio frequency circuit according to claim 1, wherein:
   the passband of the first acoustic wave filter is NR, having a frequency range from 4.4 GHz to 5.0 GHz, and
   the passband of the second acoustic wave filter is NR-U with a frequency range from 5.15 GHz to 5.925 GHz.

13. The radio frequency circuit according to claim 1, wherein:
   the passband of the first acoustic wave filter is NR-U with a frequency range from 5.15 GHz to 5.35 GHz, and
   the passband of the second acoustic wave filter is NR-U with a frequency range from 5.47 GHz to 5.925 GHz.

14. The radio frequency circuit according to claim 1, wherein:

the passband of the first acoustic wave filter is NR-U with a frequency range from 5.15 GHz to 5.85 GHz, and the passband of the second acoustic wave filter is NR-U with a frequency range from 5.925 GHz to 7.125 GHz.

15. A radio frequency circuit, comprising:

a substrate;

a common terminal;

a first acoustic wave filter that is disposed on the substrate, is connected to the common terminal, and includes a first acoustic wave resonator;

a first LC filter that is disposed on the substrate, is connected to the common terminal via the first acoustic wave filter, and includes at least one of an inductor or a capacitor;

a second acoustic wave filter that is disposed on the substrate, is connected to the common terminal, and includes a second acoustic wave resonator;

a second LC filter that is disposed on the substrate, is connected to the common terminal via the second acoustic wave filter, and includes at least one of an inductor or a capacitor;

a first amplifier that is connected to the first LC filter and is disposed on the substrate; and a second amplifier that is connected to the second LC filter and is disposed on the substrate, wherein:

one of the first acoustic wave filter and the second acoustic wave filter has a passband that is at least part of n79, having a frequency range from 4400 MHz to 5000 MHz, of New Radio (NR), and the other of the first acoustic wave filter and the second acoustic wave filter has a passband that is at least one of at least part of n77, having a frequency range from 3300 MHz to 4200 MHZ, of NR, at least part of n78, having a frequency range from 3300 MHz to 3800 MHZ, of NR, B42, having a frequency range from 3400 MHz to 4200 MHz, of Long Term Evolution (LTE), B43, having a frequency range from 3600 MHz to 3800 MHZ, of LTE, B48, having a frequency range from 3550 MHz to 3700 MHz, of LTE, or B49, having a frequency range from 3550 MHz to 3700 MHz, of LTE.

16. A communication device, comprising:

a radio frequency (RF) signal processing circuit that is configured to process a radio frequency signal received by an antenna element; and the radio frequency circuit according to claim 1 that is configured to transfer the radio frequency signal between the antenna element and the RF signal processing circuit.

* * * * *

UNITED STATES PATENT AND TRADEMARK OFFICE
CERTIFICATE OF CORRECTION

PATENT NO. : 11,799,516 B2  
APPLICATION NO. : 17/658899  
DATED : October 24, 2023  
INVENTOR(S) : Morio Takeuchi et al.

Page 1 of 1

It is certified that error appears in the above-identified patent and that said Letters Patent is hereby corrected as shown below:

In the Specification

Column 18, Line 36, "Variation Embodiment" should be -- Variation Embodiment 4 --.

Signed and Sealed this
Eighth Day of October, 2024

Katherine Kelly Vidal
*Director of the United States Patent and Trademark Office*